(12) United States Patent
Yamamoto et al.

(10) Patent No.: US 7,736,964 B2
(45) Date of Patent: Jun. 15, 2010

(54) SEMICONDUCTOR DEVICE, AND METHOD FOR MANUFACTURING THE SAME

(75) Inventors: Yoshiaki Yamamoto, Kanagawa (JP); Koichiro Tanaka, Kanagawa (JP); Atsuo Isobe, Kanagawa (JP); Daisuke Ohgarane, Kanagawa (JP); Shunpei Yamazaki, Tokyo (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 0 days.

(21) Appl. No.: 11/274,904

(22) Filed: Nov. 16, 2005

(65) Prior Publication Data
US 2006/0110863 A1 May 25, 2006

(30) Foreign Application Priority Data
Nov. 22, 2004 (JP) ............................. 2004-338229

(51) Int. Cl.
*H01L 21/336* (2006.01)
(52) U.S. Cl. .................... 438/197; 438/458; 438/759; 438/892; 438/982; 438/99; 438/151; 438/114; 257/492; 257/4; 257/529; 257/E51.8; 257/E31
(58) Field of Classification Search ................ 438/149, 438/458, 459
See application file for complete search history.

(56) References Cited

U.S. PATENT DOCUMENTS

| | | | |
|---|---|---|---|
| 5,166,556 A | 11/1992 | Hsu et al. | |
| 5,323,042 A * | 6/1994 | Matsumoto | 257/350 |
| 5,581,385 A | 12/1996 | Spitzer et al. | |
| 5,757,456 A | 5/1998 | Yamazaki et al. | |
| 5,766,977 A | 6/1998 | Yamazaki | |

(Continued)

FOREIGN PATENT DOCUMENTS

EP    1 193 759    4/2002

(Continued)

OTHER PUBLICATIONS

Search Report (Patent Cooperation Treaty Application No. PCT/JP2004/018978) dated Mar. 15, 2005.

(Continued)

*Primary Examiner*—Fernando L Toledo
*Assistant Examiner*—Ankush K Singal
(74) *Attorney, Agent, or Firm*—Eric J. Robinson; Robinson Intellectual Property Law Office, P.C.

(57) ABSTRACT

It is an object of the present invention to provide a method of separating a thin film transistor, and circuit or a semiconductor device including the thin film transistor from a substrate by a method different from that disclosed in the patent document 1 and transposing the thin film transistor, and the circuit or the semiconductor device to a substrate having flexibility. According to the present invention, a large opening or a plurality of openings is formed at an insulating film, a conductive film connected to a thin film transistor is formed at the opening, and a peeling layer is removed, then, a layer having the thin film transistor is transposed to a substrate provided with a conductive film or the like. A thin film transistor according to the present invention has a semiconductor film which is crystallized by laser irradiation and prevents a peeling layer from exposing at laser irradiation not to be irradiated with laser light.

30 Claims, 13 Drawing Sheets

U.S. PATENT DOCUMENTS

| | | | |
|---|---|---|---|
| 5,815,226 A * | 9/1998 | Yamazaki et al. | 349/111 |
| 5,821,138 A * | 10/1998 | Yamazaki et al. | 438/166 |
| 6,022,792 A | 2/2000 | Ishii et al. | |
| 6,118,502 A * | 9/2000 | Yamazaki et al. | 349/45 |
| 6,197,702 B1 | 3/2001 | Tanabe et al. | |
| 6,274,887 B1 * | 8/2001 | Yamazaki et al. | 257/72 |
| 6,281,552 B1 * | 8/2001 | Kawasaki et al. | 257/350 |
| 6,376,333 B1 * | 4/2002 | Yamazaki et al. | 438/458 |
| 6,545,359 B1 * | 4/2003 | Ohtani et al. | 257/758 |
| 6,556,265 B1 * | 4/2003 | Murade | 349/111 |
| 6,670,641 B1 * | 12/2003 | Fukuda et al. | 257/66 |
| 6,682,963 B2 | 1/2004 | Ishikawa | |
| 6,750,476 B2 * | 6/2004 | Katayama | 257/59 |
| 6,887,650 B2 | 5/2005 | Shimoda et al. | |
| 6,963,084 B2 * | 11/2005 | Arao et al. | 257/59 |
| 7,050,138 B1 * | 5/2006 | Yamazaki et al. | 349/152 |
| 7,060,153 B2 * | 6/2006 | Yamazaki et al. | 156/249 |
| 7,064,388 B2 * | 6/2006 | Hayakawa et al. | 257/347 |
| 7,070,207 B2 | 7/2006 | Asai | |
| 7,091,070 B2 * | 8/2006 | Imai et al. | 438/149 |
| 7,109,071 B2 | 9/2006 | Ishikawa | |
| 7,119,364 B2 * | 10/2006 | Yamazaki | 257/57 |
| 7,170,570 B2 * | 1/2007 | Kim et al. | 349/43 |
| 7,271,076 B2 | 9/2007 | Yamazaki et al. | |
| 7,297,579 B2 * | 11/2007 | Nagao et al. | 438/163 |
| 7,368,318 B2 | 5/2008 | Yamazaki | |
| 7,381,991 B2 * | 6/2008 | Yamazaki et al. | 257/72 |
| 7,420,208 B2 * | 9/2008 | Yamazaki et al. | 257/59 |
| 7,466,293 B2 * | 12/2008 | Yamauchi et al. | 345/76 |
| 7,525,165 B2 * | 4/2009 | Yamazaki et al. | 257/408 |
| 2001/0015256 A1 * | 8/2001 | Yamazaki et al. | 156/289 |
| 2001/0053559 A1 | 12/2001 | Nagao et al. | |
| 2002/0030189 A1 * | 3/2002 | Ishikawa | 257/59 |
| 2003/0022403 A1 | 1/2003 | Shimoda et al. | |
| 2004/0079952 A1 * | 4/2004 | Yamazaki et al. | 257/81 |
| 2004/0251479 A1 * | 12/2004 | Tsutsui et al. | 257/249 |
| 2004/0256618 A1 * | 12/2004 | Imai et al. | 257/59 |
| 2005/0023525 A1 * | 2/2005 | Ishikawa | 257/59 |
| 2005/0070038 A1 * | 3/2005 | Yamazaki et al. | 438/30 |
| 2005/0148121 A1 | 7/2005 | Yamazaki et al. | |
| 2005/0176179 A1 * | 8/2005 | Ikushima et al. | 438/125 |
| 2006/0068536 A1 * | 3/2006 | Yamazaki | 438/197 |
| 2006/0099738 A1 * | 5/2006 | Yamazaki | 438/114 |
| 2006/0170077 A1 * | 8/2006 | Aoki et al. | 257/642 |
| 2006/0270191 A1 * | 11/2006 | Tamura et al. | 438/458 |
| 2007/0023758 A1 * | 2/2007 | Tsurume et al. | 257/66 |
| 2007/0085947 A1 * | 4/2007 | Yoon et al. | 349/113 |
| 2009/0008715 A1 | 1/2009 | Yamazaki | |

FOREIGN PATENT DOCUMENTS

| | | |
|---|---|---|
| JP | 08-254686 | 10/1996 |
| JP | 2001-272923 | 10/2001 |
| JP | 2003-203898 | 7/2003 |
| WO | WO 03/010825 | 2/2003 |
| WO | WO 2005/057658 | 6/2005 |

OTHER PUBLICATIONS

Search Report (Patent Cooperation Treaty Application No. PCT/JP2005/001541) dated Mar. 22, 2005.

Written Opinion (Patent Cooperation Treaty Application No. PCT/JP2005/001541) dated Mar. 22, 2005.

Nikkei Electronics, *"Sense of Crisis" is a trigger. Ignited evolution of a sesame-grain sized chip*, Leading Trends, Nov. 18, 2002, pp. 67-76.

Nikkei Electronics, *"Sense of Crisis" is a trigger. Ignited evolution of a sesame-grain sized chip*, Leading Trends, Nov. 18, 2002, No. 835, pp. 67-76.

* cited by examiner

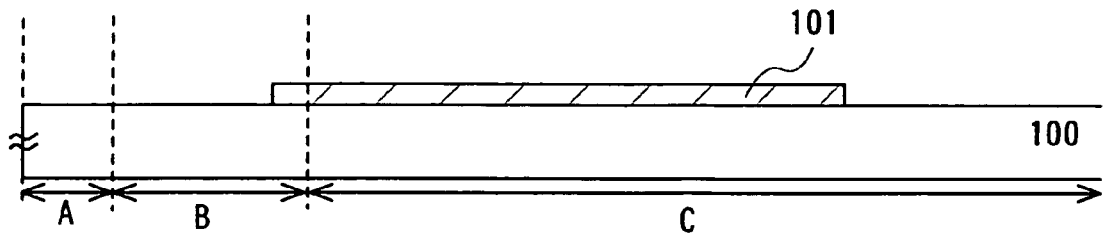
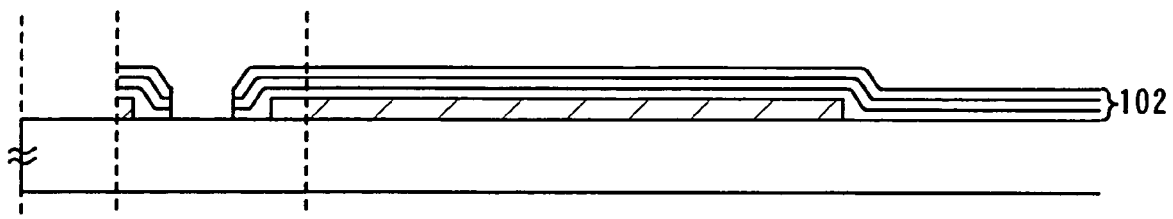
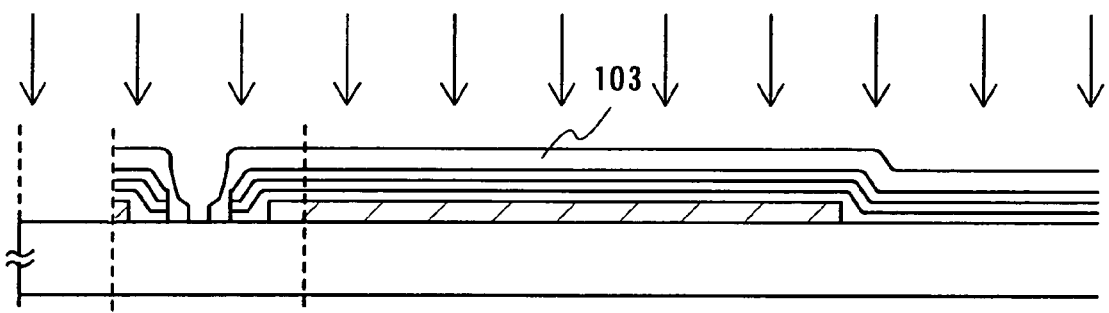
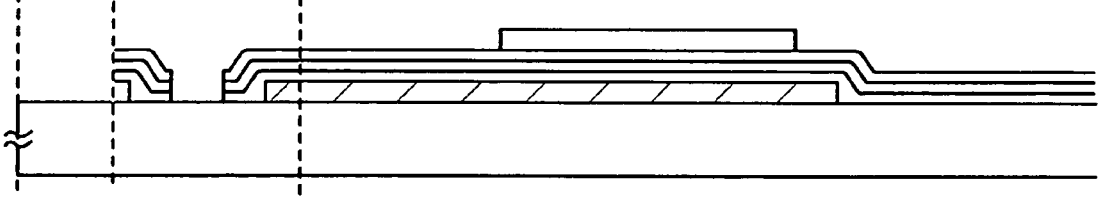
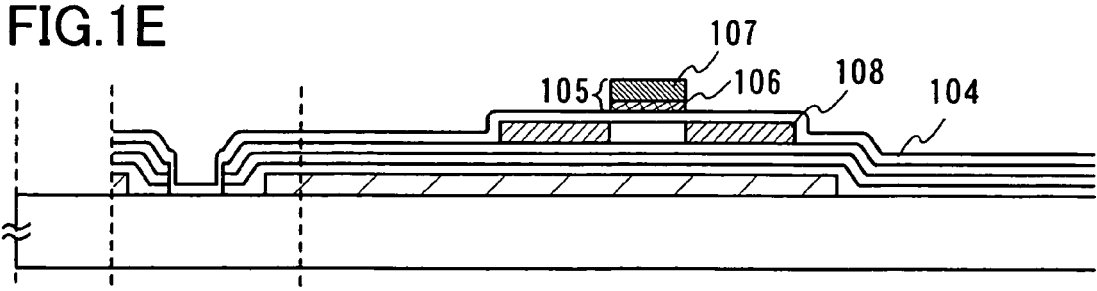

SEMICONDUCTOR DEVICE, AND METHOD FOR MANUFACTURING THE SAME

BACKGROUND OF THE INVENTION

1. Field of the Invention

The present invention relates to a semiconductor device and a manufacturing method of the semiconductor device.

2. Related Art

A substrate having flexibility such as a plastic substrate has an advantage over a glass substrate. Therefore, a method for forming a semiconductor device employing a flexible substrate has been developed.

For example, there is a method that a driver circuit is formed over a support substrate via a peeling layer, the peeling layer is removed to separate the driver circuit from the support substrate, and the driver circuit is mechanically attached to a different substrate such as a plastic substrate to make electrical connection (see patent document 1).

Patent document 1: Unexamined patent publication No. 8-254686

SUMMARY OF THE INVENTION

It is an object of the present invention to provide a method of separating a thin film transistor, and circuit or a semiconductor device including the thin film transistor from a substrate and transposing the thin film transistor, and the circuit or the semiconductor device over a substrate having flexibility, which is different from the method disclosed in the patent document 1.

The patent document 1 discloses that a peeling layer is formed over one surface of a substrate, a driver circuit is formed over the peeling layer, and the peeling layer is removed. In that case, the substrate and the driver circuit may be completely separated from each other and an extreme thin and lightweight driver circuit or the like may be flied away when separating the driver circuit from the substrate. In view of the foregoing, it is another object of the present invention to provide a novel method of separating easily with accuracy a circuit or a semiconductor device from a substrate.

It is more another object of the present invention to reduce defects due to laser irradiation when crystallizing a semiconductor film by laser irradiation in the case of separating a circuit or a semiconductor device from a substrate.

According to the present invention, a larger opening than the conventional opening or a plurality of openings is formed at an insulating film, a conductive film connected to a thin film transistor is formed at the opening, and a peeling layer is removed, then, a layer having the thin film transistor is transposed over a different substrate. A conductive film or the like is formed over a different substrate. As a result, the conductive film connected to the thin film transistor can be easily connected to the conductive film over the different substrate. By forming selectively the peeling layer, the layer having the thin film transistor can be prevented from flying away.

A thin film transistor according to the present invention has a semiconductor film which is crystallized by laser irradiation and prevents a peeling layer from exposing during laser irradiation so that the peeling layer is not irradiated with laser light. As a result, peeling of the peeling layer can be prevented.

In a manufacturing process of a thin film transistor according to the present invention, an insulating film, a semiconductor film, or a peeling layer at the periphery of a substrate are removed. As a result, generation of refuse can be reduced.

Specifically, the present invention provides a method for manufacturing a semiconductor device comprising the steps of: forming selectively a peeling layer over a first substrate; forming a layer having a plurality of thin film transistors over the peeling layer; forming a first opening so that a part of a semiconductor film of the thin film transistor is exposed and forming a second opening so that a the first substrate is exposed between the peeling layers; forming a first conductive film at the first opening and at the second opening; processing the first conductive film to form a wiring at the first opening portion and to form a source or drain electrode at the second opening; forming a third conductive film so that the peeling layer is exposed; separating the layer having the plurality of thin film transistors from the first substrate by removing the peeling layer by introducing an etching agent into the third opening; and pasting the layer having the plurality of thin film transistors onto the second substrate so that the wiring and the second conductive film provided over the second substrate are electrically connected to each other.

Another mode according to the present invention is a method for manufacturing a semiconductor device comprising the steps of: forming selectively a peeling layer over a first substrate; forming a base insulating film over the peeling layer; removing the base insulating film at a periphery of the substrate; forming a semiconductor film over the base insulating film; removing the semiconductor film at a periphery of the substrate; forming a marker at the semiconductor film without exposing the peeling layer; emitting laser to the semiconductor film by employing the marker; forming an island like semiconductor film by processing the semiconductor film; forming a gate insulating film and a gate electrode sequentially over the island like semiconductor film; forming an impurity region by adding an impurity to a part of the island like semiconductor film by using the gate electrode; forming a first opening so that the impurity region is exposed and forming a second opening so that the first substrate is exposed between the peeling layers; forming a first conductive film at the first opening and at the second opening; processing the first conductive film to form a wiring at the first opening and to form a source or drain electrode at the second opening; forming a third opening so that the peeling layer is exposed; separating the layer having the plurality of thin film transistors from the first substrate by removing the peeling layer by introducing an etching agent into the third opening; and pasting the layer having the plurality of thin film transistors onto the second substrate so that the wiring and the second conductive film provided over the second substrate are electrically connected to each other.

In the present invention, a plurality of second openings is preferably formed between the peeling layers. As a result, the conductive film connected to the thin film transistor can be easily connected to the conductive film over the different substrate.

In the present invention, the marker can be formed at the semiconductor film without exposing the peeling layer, and so peeling of the peeling layer can be prevented.

More another mode of the present invention is a semiconductor device comprising: a layer having a plurality of thin film transistors; a source or drain electrode connected to a semiconductor film of the thin film transistor which is formed in a first opening; a wiring connected to the source or drain electrode which is formed in a plurality of second openings provided between the thin film transistors; a substrate; and a conductive film provided over the substrate; wherein the wiring and the conductive film are electrically connected to each other by pasting the layer having the thin film transistors and the substrate to each other.

In the present invention, the thin film transistor has a semiconductor film having a thickness of from 40 to 170 nm. As a result, an extremely thin semiconductor device can be formed.

According to the present invention, a region where a substrate and a base insulating film are closely-attached to each other can be provided, and so a thin film integrated circuit can be prevented from flying and the thin film integrated circuit can be manufactured easily.

According to the present invention, a larger opening than the conventional opening or a plurality of openings is formed at an insulating film, a conductive film formed at a large opening potion or a plurality of openings can be easily connected to another conductive film over the different substrate. Further, according to the present invention, the numbers of defective contacts can be reduced and a strength adhesion can be enhanced.

According to the present invention, peeling of the peeling layer can be prevented.

According to the present invention, generation of refuse can be reduced.

According to the present invention, a semiconductor device is formed by using a substrate other than a silicon substrate, a large number of semiconductor devices can be manufactured at once, and a semiconductor device with reduced costs can be provided.

These and other objects, features and advantages of the present invention will become more apparent upon reading of the following detailed description along with the accompanied drawings.

BRIEF DESCRIPTION OF THE DRAWINGS

FIGS. 1A to 1E are views for showing a manufacturing process of a semiconductor device according to the present invention;

DESCRIPTION OF THE INVENTION

Figure 2A:
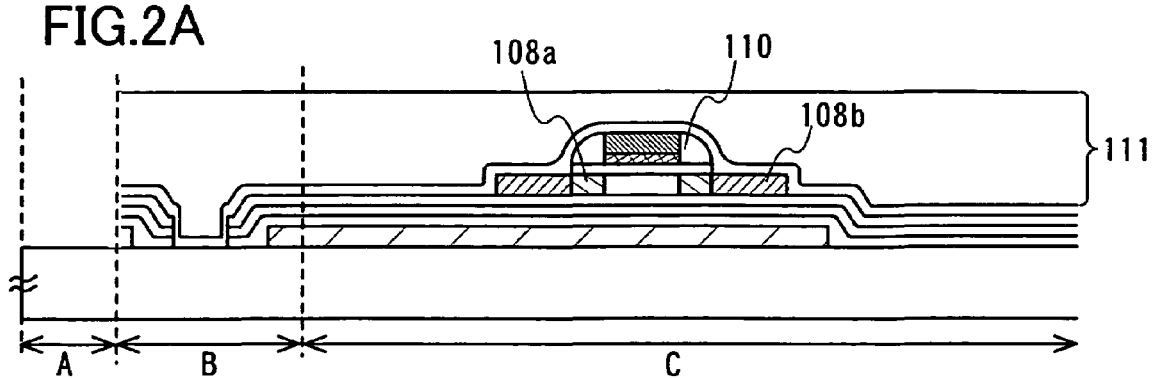
FIGS. 2A to 2D are views for showing a manufacturing process of a semiconductor device according to the present invention.

The above and further objects and novel features of the invention will more fully appear from the following details description when the same is read in connection with the accompanying drawings. As the present invention may be embodied in several forms, it is to be understood that various changes and modifications will be apparent to those skilled in the art without departing from the spirit of essential characteristics of the present invention. Therefore, unless otherwise such changes and modifications depart from the scope of the present invention hereinafter described, they should be construed as being included therein. Through the drawings of the embodiments, like components are denoted by like numerals as of the first embodiment and will not be further explained.

Embodiment 1

In this embodiment, a method for manufacturing a semiconductor device is explained.

As shown in FIG. 1A, a peeling layer 101 is formed over a substrate 100. The peeling layer 101 can be formed by a sputtering method, a plasma CVD method, or the like. As a material for the peeling layer 101, at least one element among tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Oc), iridium (Ir), and silicon (Si); an alloy material containing the element as its main component; or a compound material containing the element as its main component. Alternatively, oxide, nitride, or oxynitride of the foregoing element can be used. In the case of forming a layer containing silicon, the layer may have any one of an amorphous structure, a microcrystal structure, or a multicrystal structure.

The peeling layer 101 can be formed to have a single layer structure or a laminated structure. In the case that the peeling layer 101 is formed to have a single layer structure, tungsten, molybdenum, or mixture of these elements can be used, alternatively, oxide, nitride, or oxynitride of the foregoing material can be used as a material for the peeling layer 101. The mixture of tungsten and molybdenum is, for example, alloy of tungsten and molybdenum. On the other hand, in the case that the peeling layer 101 is formed to have a laminated structure, tungsten, molybdenum, or mixture of these elements is preferably used as a bottom layer of the peeling layer 101, whereas oxide, nitride, or oxynitride of tungsten, molybdenum, or mixture of these elements is preferably used as the top layer of the peeling layer 101. In the case that a laminated structure composed of tungsten and oxide of tungsten is used, oxide containing tungsten is formed at an interface between tungsten and silicon oxide by forming tungsten and forming oxide of tungsten such as silicon oxide thereover. A peeling layer formed by tungsten and oxide of tungsten can be formed by using the oxide containing tungsten formed at the interface. By forming nitride such as silicon nitride over tungsten, nitride containing tungsten is formed at an interface between the tungsten and the silicon nitride. A peeling layer formed by tungsten and nitride containing tungsten can be formed by using the nitride containing tungsten formed at the interface. Such the manufacturing process can be applied to the other peeling layer material such as molybdenum or mixture of tungsten and molybdenum.

Oxide of tungsten can be referred to as WOx (x=2 to 3). Specifically, there are $WO_2$ (x=2), $W_2O_5$ (x=2.5), $W_4O_{11}$ (x=2.75), and $WO_3$ (x=3). The oxide of tungsten is not limited to the foregoing chemical formula, especially, the value of x. Since an etching rate depends on a structure of the oxide of tungsten, the oxide of tungsten can be selected so as to obtain a desired etching rate. For example, oxide of tungsten manufactured by a sputtering method in oxygen atmosphere has a favorable etching rate to an etching material to be hereinafter described. It is found that the oxide of tungsten is in a range of WOx (x=0 to 3).

In this embodiment, a film containing tungsten is formed as the peeling layer 101 over the entire surface of the substrate 100 and is patterned by a photolithography method to form selectively the peeling layer 101. By forming the peeling layer 101 selectively, a thin film transistor and the like are not completely separated from the substrate 100 when removing the peeling layer 101. As a result, a thin film transistor which is extremely thin and light does not fly from the substrate and the thin film transistor can be easily transferred to different substrate. The present invention is not limited thereto. The peeling layer 101 formed over the entire surface of the substrate 100 can be subject to the subsequent process.

Figure 13A:
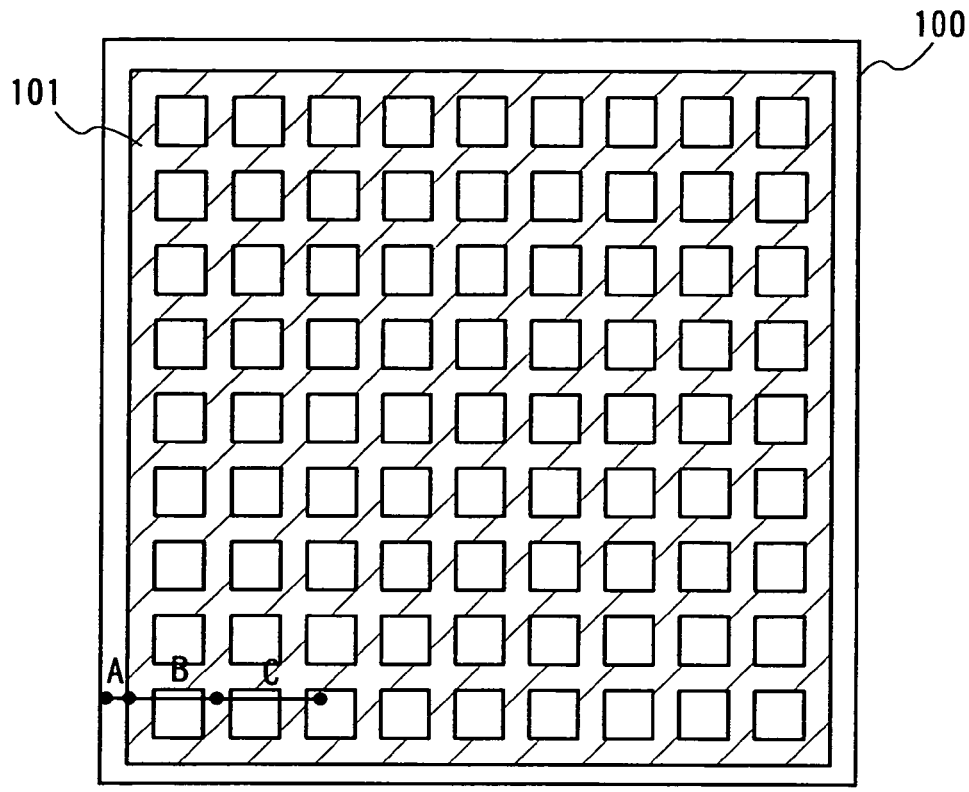
FIGS. 13A and 13B are top views for showing a manufacturing process of applied with a semiconductor device according to the present invention.

In the drawings, a region A is an edge of the substrate 100, a region B is a region for forming a marker 135, and a region C is a region provided with a thin film transistor (refer to FIG. 13A). In the region B, the peeling layer 101 is prevented from being formed at least at the bottom of the marker 135 which is to be formed later (refer to FIG. 13A). Even if the peeling layer 101 is formed at the bottom of the marker 135 to be formed later, the peeling layer 101 can be removed.

In that case, forming the peeling layer 101 over the entire surface causes microscopic refuse when transporting the substrate 100 to carry out the subsequent process or providing the substrate 100 to each device. The refuse is attached to the surface or the like of the substrate 100 during a process, which leads to deterioration of manufacturing yield. According to the present invention, the peeling layer 101 is not formed over the edge, that is, the periphery of the substrate 100 (which corresponds to the region A in the drawings) or removed in the case that the peeling layer 101 is formed thereover (refer to FIG. 13A). In the case that the peeling layer 101 in the periphery of the substrate 100, dry etching or $O_2$ ashing can be utilized. As noted above, refuse can be prevented from generating during a process.

In this embodiment, the peeling layer 101 is formed on the substrate 100; however, the present invention is not limited thereto. An insulating film such as a silicon oxide film, a silicon nitride film, or a silicon oxynitride film can be formed as a base film between the substrate 100 and the peeling layer 101.

As shown in FIG. 1B, a base insulating film 102 is formed to cover the peeling layer 101. Impurities from the peeling layer 101 or the substrate 100 can be prevented from penetrating by virtue of the base insulating film 102. The base insulating film 102 can be formed by a sputtering method or a plasma CVD method.

As a material for the base insulating layer, oxide containing silicon, nitride containing nitride, or oxynitride containing silicon can be used. These materials are respectively referred to as a silicon oxide film, a silicon nitride film, and a silicon oxynitride film.

The base insulating film 102 is formed to have a single layer structure or a laminated layer structure. In the case of the laminated structure, a silicon nitride film or a silicon oxynitride film is preferably used for at least a layer composing the laminated structure. This is attributed from the fact that such an insulating film containing nitrogen has high protection effectiveness against impurities. In the case of the laminated structure, it is better to use silicon oxide films for a topmost layer and an undermost layer. This is attributed from the fact that the silicon oxide film has high adhesiveness with the peeling layer 101 or a semiconductor film which is to be formed later. In view of this, the base insulating film 102 is preferably formed to have a laminated structure formed by stacking a silicon oxide film, a silicon nitride film, and a silicon oxide film sequentially, or a laminated structure formed by stacking a silicon oxide film, a silicon oxynitride film, and a silicon oxide film sequentially. Such the silicon film can be formed continuously without exposing to the air by controlling a starting material gas in the case of using a plasma CVD method.

In that case, forming the base insulating film 102 over the entire surface causes microscopic refuse when transporting the substrate 100 to carry out the subsequent process or providing the substrate 100 to each device. The refuse is attached to the surface of the like of the substrate 100 during a process, which leads to deterioration of manufacturing yield. According to the present invention, the base insulating film 102 is not formed over the edge, that is, the periphery of the substrate 100 (which corresponds to the region A in the drawings) or removed in the case that the base insulating film 102 is formed thereover (refer to FIG. 13A). In the case that the base insulating film 102 in the periphery of the substrate 100, dry etching or $O_2$ ashing can be utilized. As noted above, refuse can be prevented from generating during a process.

In that case, a part of the base insulating film 102 in the region B is preferably removed. Note that an edge of the peeling layer 101 is made not to be exposed in the region B, since the region B forms a marker in the subsequent process.

A semiconductor film 103 is formed over the base insulating film 102. The semiconductor film 103 has an extremely thin thickness of from 40 to 170 nm. As a material for the semiconductor film, silicon, germanium, or a mixture of silicon and germanium can be used. The semiconductor film may be any one state of an amorphous state, a crystalline state, and a semiamorphous state (also referred to as SAS) which is a mixture of the amorphous state and the crystalline state. The SAS contains a microcrystalline semiconductor that crystal grains with diameters of 0.5 to 20 nm can be observed in an amorphous semiconductor.

A semiconductor film having a crystalline state can be formed by forming an amorphous semiconductor film and crystallizing the amorphous semiconductor film by heat treatment. As the heat treatment, a heating furnace, laser irradiation, or light irradiation emitted from a lamp instead of laser (lamp annealing), or a method which is combination of the foregoing methods can be used.

In the case of using laser irradiation, continuous-wave laser beam (CW laser beam) or pulse oscillation laser beam (pulse laser beam) can be used.

A laser beam which is a pulse oscillation type and which can emit laser at repetition frequency so that the next pulse laser light can be emitted until the semiconductor film becomes solidified after being melted due to laser light. By oscillating laser beam at such the frequency, crystal grains which are continuously grown in a scanning direction can be obtained. A specific repetition frequency of a laser beam is 10 MHz or more and uses a frequency band which is extremely higher than the frequency band which is typically used of several ten Hz to several hundreds Hz.

As the laser beam, a laser beam oscillated from one kind or a plurality kinds among Ar laser, Kr laser, excimer laser, YAG laser, $Y_2O_3$ laser, $YVO_4$ laser, YLF laser, $YAlO_3$ laser, $GdVO_4$ laser, glass laser, ruby laser, alexandrite laser, Ti: sapphire laser, copper vapor laser, or gold vapor laser. Besides, ceramic laser can be used. A fundamental wave of such the laser beam or laser beam which is formed by converting the fundamental wave from the second harmonic to the fourth harmonic with a nonlinear optical element can be emitted. In the case that Nd: $YVO_4$ laser (fundamental wave 1064 nm) is used as a fundamental wave, the wavelength of the second harmonic is 532 nm, whereas the wavelength of the third harmonic is 355 nm. By converting into harmonics, energy absorption efficiency to a semiconductor film can be improved and crystals in large grain diameters can be obtained. In order to prevent nonlinear optical element from being broken, laser output from a laser oscillator is approximately 15 W in the case of CW laser at a wavelength of 532 nm.

Crystals in large grain diameters can be obtained by emitting concurrently a fundamental wave to assist the harmonics.

In that case, a continuous-wave fundamental wave laser beam and a pulse oscillation harmonic laser beam can be emitted besides a continuous-wave fundamental wave laser beam and a continuous-wave harmonic laser beam. By emitting a plurality of laser beams, energy can be made up.

In the foregoing laser beam, laser energy density of approximately 0.01 to 100 $MW/cm^2$ is required (preferably, 0.1 to 10 $MW/cm^2$). These laser beams are processed into linear shapes to be emitted. In the case of CW laser of 10 W, the CW laser can be processed into a linear beam having the size of approximately 300 μm in a longitudinal direction and approximately 10 μm in a latitudinal direction.

A scanning rate of the laser beam is approximately 10 to 2000 cm/sec. Scanning is required at a plurality of times in order to perform laser irradiation for the entire surface of the semiconductor film. In that case, the scanning is performed so that the edges of a laser irradiation region are overlapped with each other.

Favorable crystallinity may not be able to be obtained since laser intensity of the laser beam processed in a linear shape becomes weak toward the edge of the laser irradiation region. A region in which favorable crystallinity cannot be obtained is referred to as defective region. It is required that the semiconductor film is processed so that a thin film transistor, especially, a channel formation region thereof, is not provided in the defective region. Therefore, the position of the semiconductor film irradiated with laser light is required to be controlled with accuracy. The position is preferably controlled with a CCD camera or the like based on a marker by providing a marker for being used as the base. A shooting means such as the CCD camera or the like is connected to a computer to control the position by the computer.

A micro crystal semiconductor film is formed by using $SiH_4$ and $F_2$, or $SiH_4$ and $H_2$. Thereafter, the film may be crystallized by the above-mentioned laser irradiation.

As another heating treatment, an amorphous semiconductor film is heated at 500 to 550° C. for 2 to 20 hours in the case of using a heating furnace. In that case, the temperature is preferably set at multistage in the range of 500 to 550° C. so as to be gradually increased. Since hydrogen or the like in the amorphous semiconductor film is released by an initial low temperature heating process, film unevenness due to crystallization can be reduced, so-called, dehydrogenation can be performed. Moreover, a metal element which can promotes crystallization, for example, nitrogen is preferably formed over an amorphous semiconductor film since heating temperature can be reduced. The above-mentioned laser irradiation can be performed in addition to the heating furnace.

There is a threat that the metal element may have a harmful effect on electric characteristics of a semiconductor element, and so a gettering process for reducing or removing the metal element is carried out. For example, a process may be performed so that a metal element is trapped with an amorphous semiconductor film as a gettering sink. Elements such as argon or phosphorus are preferably added to the amorphous semiconductor film serving as a gettering sink since distortion is generated in the amorphous semiconductor film by adding the elements, which leads to easy trapping of the metal element. The gettering sink is preferably formed on a semiconductor film which is crystallized with a metal element since trapping can be carried out efficiently.

A crystalline semiconductor film can be formed on a surface. In that case, a fluorine gas such as $GeF_4$ or $F_2$, and a silane gas such as $SiH_4$ or $Si_2H_6$ can be used to form the crystalline semiconductor film on the surface with heat or plasma. In the case that the crystalline semiconductor film is formed on a surface and high temperature processing is required, a quartz substrate having high heat resistance is preferably used as the substrate 100.

In the case of performing such the laser irradiation, especially, CW laser, it is required to prevent the peeling layer 101 from being irradiated with the laser light. This is attributed from the fact that there is threat that the peeling layer 101 is melted by energy of the laser, as a result, a phenomenon of opening holes at the peeling layer or the semiconductor film (hereinafter, peeling) is occurred. The problem becomes pronounced in the case of using CW laser which has longer melting time than that of pulse laser According to the present invention, the base insulating film 102 is removed so that the peeling layer 101 is not exposed in the region B. According to the present invention, the peeling layer 101 is not exposed after passing through the subsequent process. Therefore, it is better to form at least a semiconductor film over the peeling layer 101 since energy of laser can be attenuated to prevent the peeling layer 101 from melting by the semiconductor film or the like formed over the peeling layer 101. Since the laser energy selects a wavelength which is absorbed by the semiconductor film, a semiconductor film is preferably formed over the peeling layer 101. A film which absorbs laser energy is referred to as an absorption film.

The absorption film is not limited to the semiconductor film 103. For example, the absorption film can be formed on the peeling layer 101. As a material for the semiconductor film 103, silicon oxide, silicon nitride, or silicon oxynitride can be used. Alternatively, the absorption film can be formed by stacking films including these materials. An absorption rate of laser energy can be controlled by a material or a thickness of the absorption film, or a laminated structure. By forming the absorption film on the peeling layer 101, layout restriction such as preventing exposure of the peeling layer 101 can be eliminated in a manufacture process of the marker 135.

In view of the foregoing, a method for crystallizing an amorphous semiconductor film with CW laser is explained in this embodiment.

As shown in FIG. 1C, the semiconductor film 103 which is amorphous is formed over the entire surface of the substrate 100 by a plasma CVD method. The semiconductor film 103 is formed to have a thickness of 0.2 μm or less, typically, from 40 to 170 nm, preferably, 50 to 150 nm. In that case, an amorphous semiconductor film formed in the periphery of the substrate 100 is removed by $O_2$ ashing or the like. As a result, generation of refuse can be reduced (refer to FIG. 13B).

Figure 13B:
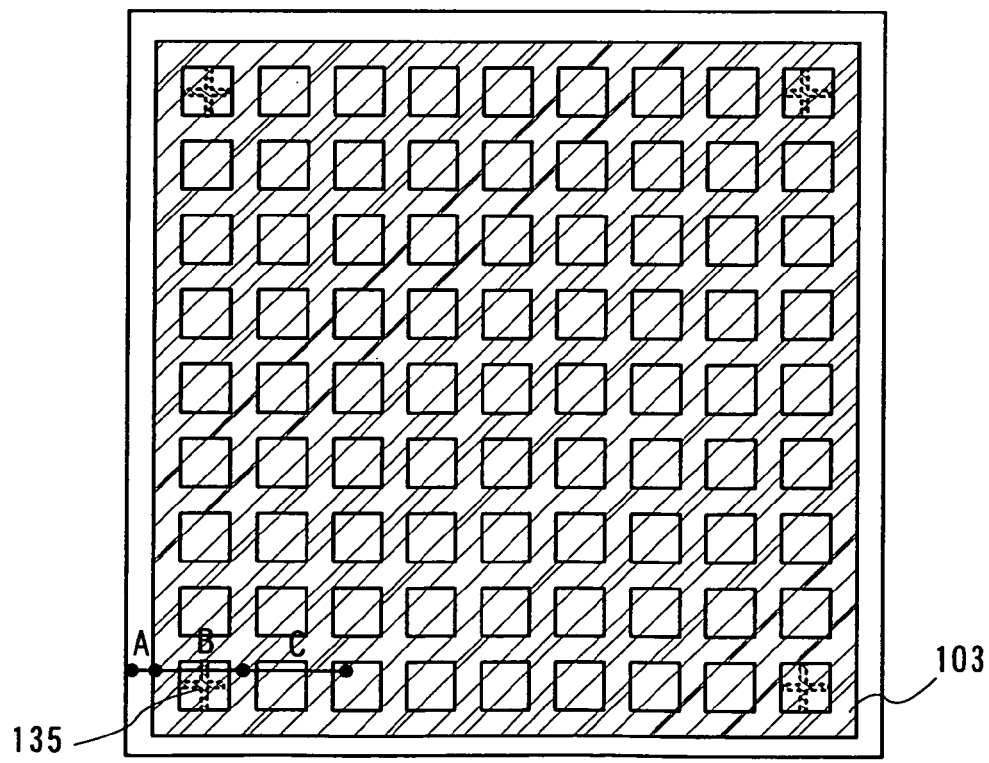

As noted above, the marker 135 is formed at the semiconductor film 103 in the region B in order to control with accuracy the position of CW laser irradiation (refer to FIG. 13B). The marker 135 can be formed by etching the semiconductor film by a photolithography method. Besides, the marker can be formed by plotting with laser on the semiconductor film. In that case, $CO_2$ laser can be used. Such the marker 135 is often formed at the outside of the substrate 100. This is attributed from the fact that the substrate 100 is warped (the warp becomes apparent with increasing the substrate size); however, the effects of the warp can be reduced by forming markers at least at four outside corners of the substrate 100 and by positioning all markers at predetermined positions. The marker can be in any shape, for example, a cross shape, a round shape, a horn shape, a linear shape, or the like.

In a region where the marker 135 is formed by etching the semiconductor film 103, the semiconductor film 103 over the peeling layer 101 is removed. Hence, the peeling layer 101 becomes exposed in case that the base insulating film 102 or the semiconductor film 103 over the peeling layer 101 is removed. Consequently, the marker 135 is formed so that the peeling layer 101 is not exposed. Especially in the case that the peeling layer 101 is formed by a film having a metal element, laser energy is easily absorbed and a problem of peeling becomes pronounced, and so the structure of the marker 135 is devised so that the peeling layer 101 is not irradiated with laser.

In order not to expose the peeling layer 101, the peeling layer 101 in the region B and especially below the marker 135 may be removed. In the case that the peeling layer 101 is formed in the region B and especially below the marker 135, at least the base insulating film 102 or the semiconductor film 103 is left. The base insulating film 102 or the semiconductor film 103 is used as the absorption film. In case of leaving the semiconductor film 103, the marker is formed, for example, at the semiconductor film 103 where the peeling layer 101 is not formed therebelow since the peeling layer 101 is selectively formed. Alternatively, the marker can be formed at the semiconductor film 103 which is formed at the outside of the peeling layer 101.

According to the present invention, the term that "the peeling layer 101 is not exposed" means that the peeling layer 101 is not directly irradiated with laser. A film which attenuates laser energy, for example, the semiconductor film 103, is preferably formed to cover not only the surface of the peeling layer 101 but also its side face.

Thereafter, positioning of the substrate 100 is performed with the marker. In that case, the positioning can be performed with accuracy by image processing with the CCD camera and the computer connecting to the CCD camera.

Then, the semiconductor film is crystallized by emitting CW laser.

The CW laser is not directly emitted to the peeling layer 101. Further, energy of the CW laser is attenuated by the semiconductor film 103 or the like formed over the peeling layer 101. As a result, peeling of the peeling layer 101 can be prevented. The semiconductor film serves as an absorption layer for laser light. The function as the absorption layer can be improved by a material or a thickness of the semiconductor film.

Other film than the semiconductor film 103 can be formed over the peeling layer 101. The film can serve as an absorption layer. In that case, the function as the absorption layer can be improved by a material or a thickness of a film which is employed.

In the case that the semiconductor film is irradiated with laser, the semiconductor film is preferably heated by a heating furnace before the laser irradiation in order to increase resistance properties against laser. For example, the semiconductor film is heated at 500° C. for 1 hour. The heating treatment may change a crystalline state of oxide of the foregoing element which is formed as the peeling layer. As a result, brittleness can be improved at both surfaces of the oxide or in a crystal grain boundary within the oxide. Subsequently, thin film transistor or the like can be easily separated from the substrate 100. In order to change the crystal state of such the oxide, it is better to perform heat treatment at approximately 400 to 550° C. for 0.5 to 5 hours.

As shown in FIG. 1D, the semiconductor film 103 which is crystallized as described above is processed into a predetermined shape. Further, the processed semiconductor film can be referred to as an island like semiconductor film. At this time, the semiconductor film which is used as a marker is removed.

Thereafter, as shown in FIG. 1E, an insulating film serving as a gate insulating film 104 is formed so as to cover the island like semiconductor film. The gate insulating film can be formed by a sputtering method or a plasma CVD method. As the gate insulating film, a silicon oxide film, a silicon nitride film, a silicon oxynitride film containing nitrogen, or the like can be used. The gate insulating film can be formed to have a single layer structure or a laminated layer structure.

A conductive film serving as a gate electrode 105 is formed over the semiconductor film via a gate insulating film 104. The gate electrode can be formed to have a single layer structure or a laminated layer structure. The gate electrode can be made from one or a plurality of elements selected among tantalum (Ta), tungsten (W), titanium (Ti), molybdenum (Mo), aluminum (Al), copper (Cu), chromium (Cr), niobium (Nb); an alloy material containing the foregoing element as its main component; or a compound material containing the foregoing element as its main component. Alternatively, the gate electrode can be made from a semiconductor material as typified by polycrystalline silicon doped with an element such as phosphorus. In this embodiment, a tantalum nitride film is formed in a thickness of 10 to 50 nm, for example, 30 nm as a first conductive film 106 and a tungsten film in a thickness of 200 to 400 nm, for example, 370 nm is formed as a second conductive film 107, sequentially. Since such the tungsten or tantalum nitride has high heat resistance, temperature restrictions in heat treatment in the subsequent process can be relieved.

Thereafter, a mask made from an organic material (typically, resist) or an inorganic material (typically, silicon oxide) is formed over the first conductive film 106 and the second conductive film 107. A silicon oxide film can be used as the mask made from the inorganic material. The first conductive film 106 and the second conductive film 107 can be formed into fine films by etching the silicon oxide film.

In the case that the first conductive film 106 and the second conductive film 107 are processed to be fine, it is better to make the mask thin, that is, so-called a sliming process is better to be performed. For example, a width of a mask can be formed by $O_2$ ashing or the like after forming the mask made from resist. The gate electrode 105 having a fine width can be manufactured by etching the first conductive film 106 and the second conductive film 107 by using such the mask. Such the gate electrode leads to fine processing of a thin film transistor and a highly integrated thin film integrated circuit can be manufactured.

An impurity element is doped to the island like semiconductor film to form an impurity region 108. In that case, an impurity element can be doped in a self aligning manner with the gate electrode 105. As the impurity element, an n-type impurity element as typified by phosphorus or arsenic and a p-type impurity element as typified by boron can be used. By using both types of an impurity element appropriately, a CMOS circuit, an NMOS circuit, and a PMOS circuit can be manufactured.

Thereafter, an insulator 110 is formed so as to cover the gate electrode 105 or the like. The insulating film can be formed by a sputtering method or a plasma CVD method. As a material for the insulating film, an inorganic material such as silicon oxide, silicon nitride, or silicon oxynitride, or an organic material such as organic resin can be used. Then, the insulator 110 is etched by anisotropic etching based on a vertical direction so as to be left at least only at the side face of the gate electrode 105. The insulator 110 which is formed over at the side face of the gate electrode 105 can be referred to as a side wall (refer to FIG. 2A).

By the etching for forming the side wall, the gate insulating film 104 may be also etched depending on an etching rate. However, the gate insulating film can be left depending on a material for the side wall, a material for the gate insulating film, and an etching agent.

Then, an impurity element is doped by using the side wall as a mask. As a result, a low concentration impurity region 108a containing impurity elements at low density is formed below the side wall, and a high concentration impurity region 108b containing impurity elements at high density is formed at the both sides of the low concentration impurity region 108a. By providing two impurity regions, a short channel effect which is produced by miniaturizing the gate width can be prevented.

A structure having a low concentration impurity region which is not overlapped with a gate electrode is referred as an LDD (Low concentration impurity) structure, whereas a structure only having a high concentration impurity region is referred to as a single drain structure. In the case that a low concentration impurity region is overlapped with a gate electrode, the structure is referred to as a GOLD (Gate-drain Overlapped LDD) structure.

Presence or absence, or a size of an impurity formation region can be controlled depending on the side wall or the width of the side wall. Further, the density of the impurity region can be controlled by a rate of the addition of an impurity element, the density of the addition of an impurity element, and time of the addition of an impurity element.

Thereafter, an insulating film 111 is formed so as to cover the island like semiconductor film, the gate electrode 105, the gate insulating film 104, or the like. The insulating film 111 is formed by an SOG method, a droplet discharge method, a sputtering method, or a plasma CVD method. The insulating film may be a single layer structure or a lamination layer structure. As a material for the insulating film, an inorganic material or an organic material can be used. In the case that the insulating layer is formed to have a lamination structure, an inorganic material and an organic material are formed in this order. In the case of using an organic material, flatness can be improved. As the organic material, polyimide, acrylic, polyamide, polyimideamide, resist, benzocyclobutene, siloxane, or polysilazane can be used. Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. Polysilazane is an insulating film which is formed by a liquid material containing a polymer material including the bond of silicon (Si) and nitrogen (N) as a starting material. By using an inorganic material, an impurity can be prevented from penetrating into the semiconductor film. As the inorganic material, a silicon oxide film, a silicon nitride film, and a silicon oxynitride film can be used.

In this embodiment, a silicon nitride film and siloxane are successively deposited in this order by a plasma CVD method. It is better to perform heat treatment before forming an insulating film 111 or after forming any one of the insulating films in the case of forming the insulating film 111 to have a lamination structure. As the heat treatment, the same means which is used for crystallization of the semiconductor film can be used. By the heat treatment, moisture in the insulating film 111 is diffused, defects of the semiconductor film can be reduced, and activation or the like of the impurity region 108 can be performed.

Figure 2B:
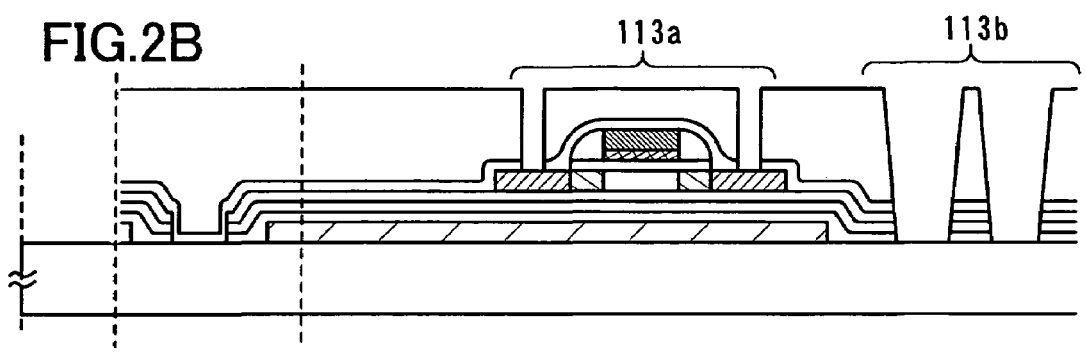

Thereafter, as shown in FIG. 2B, an opening is formed at the insulating film 111 in order to form a wiring for connecting to the impurity region. An opening 113a is formed so that the impurity region which is a part of the semiconductor film is exposed, simultaneously, an opening 113b is formed so that the substrate 100 is exposed at a predetermined region, for example, between the peeling layers 101. The opening is formed by forming a mask made from resist at a predetermined region and by etching. In a process for forming the opening, the peeling layer 101 is made not to be exposed, since there is a threat that the peeling layer 101 is etched by etching a conductive film which is formed at the opening in a subsequent process in case that the peeling layer 101 is exposed. Therefore, the peeling layer 110 can be exposed in case of obtaining a selective ratio between the peeling layer and the conductive film formed at the opening.

Figure 2C:
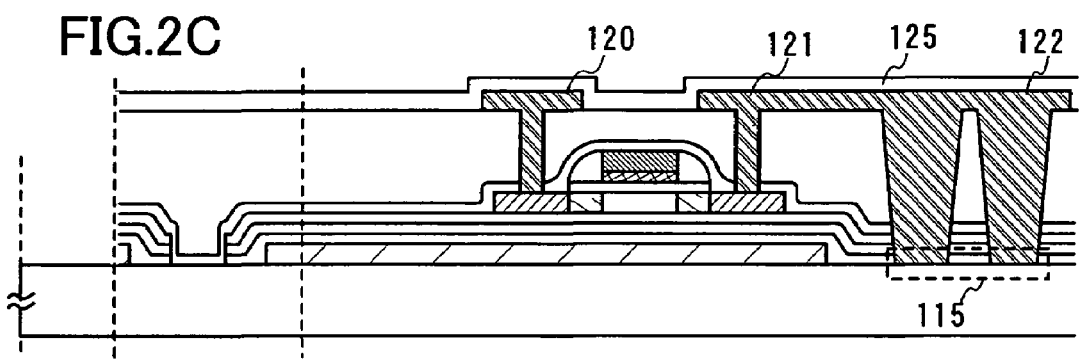

As shown in FIG. 2C, conductive films are formed at the opening 113a formed so that the impurity region is exposed and at the opening 113b formed so that the substrate 100 is exposed. The conductive films can be formed by a sputtering method or a plasma CVD method. The conductive film can be formed to have a single layer structure or a laminated layer structure. As a material for the conductive films, one element or a plurality of elements selected among titanium (Ti), aluminum (Al), and neodymium (Nd); an alloy material containing the foregoing element as its main component; or a compound material containing the foregoing element as its main component. In the case of employing a laminated structure, a barrier film may be formed between the foregoing conductive film materials. The barrier film can prevent the foregoing conductive film material from diffusing and penetrating into the semiconductor film. Further, the barrier film can reduce contact resistance and prevent hillock due to application of heat. As the barrier film, a silicon nitride film, a silicon oxynitride film, or a silicon oxide film, or nitride, oxynitride, or oxide of the conductive film material can be used. In this embodiment, the conductive film is formed to have a lamination structure composed of aluminum silicon and titanium nitride.

Thereafter, a source electrode 120 or a drain electrode 121 connected to the impurity region can be formed by processing the conductive film into a predetermined shape. After forming the source electrode 120 and the drain electrode 121, a thin film transistor can be completed. Further, a circuit structured by putting together a plurality of thin film transistors is referred to as a thin film integrated circuit.

In this embodiment, a top gate thin film transistor provided with a gate electrode over a semiconductor film is explained; however, a bottom gate thin film transistor provided with a gate electrode below a semiconductor film can be used.

By processing the foregoing conductive film, simultaneously with forming the source electrode 120 and the drain electrode 121, a wiring 122 which is connected to the source electrode or the drain electrode can be formed at the opening 113b where the substrate 100 is exposed. In this embodiment, the case that the wiring 122 connecting to the drain electrode 122 is used to explain. As used herein, the term "connect" means electrically connection. The wiring 122 is formed so as to be partly in contact with the substrate 100 in a region 115. The region 115 where a part of the wiring 122 is in contact with the substrate 100 is provided between the peeling layers 101 and preferably also provided between the islands like semiconductor films. The term "between the islands like semiconductor films" can be referred to as "between thin film transistors" which are completed later. According to the present invention, the region 115 where a part of the wiring 122 is in contact with the substrate 100 is formed big as much as possible or a plurality of the regions 115 is formed in a limited area. In this embodiment, a part of the wiring 122 is in contact with the substrate 100 at two places. The structure can make the wiring 122 connect easily to an electrode which is formed later and reduce contact resistance.

Then, an insulating film 125 is formed to cover the source electrode 120, the drain electrode 121, and the wiring 122. The insulating film 125 can be formed to have a single layer structure of a laminated layer structure. As the insulating film 125, an insulating film containing carbon such as diamond like carbon (DLC), an insulating film containing nitrogen such as silicon nitride, an organic material (preferably, epoxy resin), or the like. In the case that the insulating film 125 has a laminated layer structure, an insulating film containing carbon or an insulating film containing nitrogen is formed as a bottom layer, and epoxy resin or the like is formed as a top layer. The epoxy resin has effects of improving flatness and relieving an exogenous shock. Weight can be increased by forming the insulating film 125 by an organic material. As a result, a layer having a thin film transistor or the like can be prevented from flying and the layer having a thin film transistor or the like in an extremely thin thickness can be prevented from rolling.

Since the insulating film 125 serves as a protective film, it is formed if necessary and it is not necessarily required.

Figure 2D:
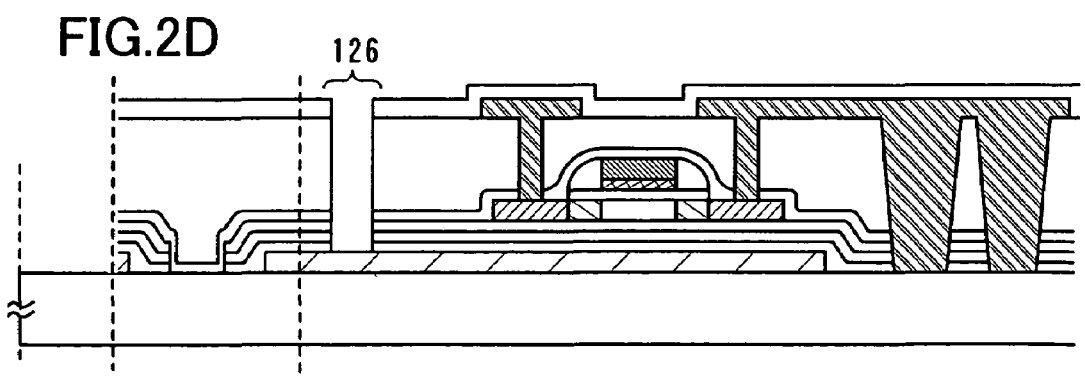

As shown in FIG. 2D, an opening 126 is formed by etching the insulating film or the like so that a part of the peeling layer 101 is selectively exposed.

Figure 3A:
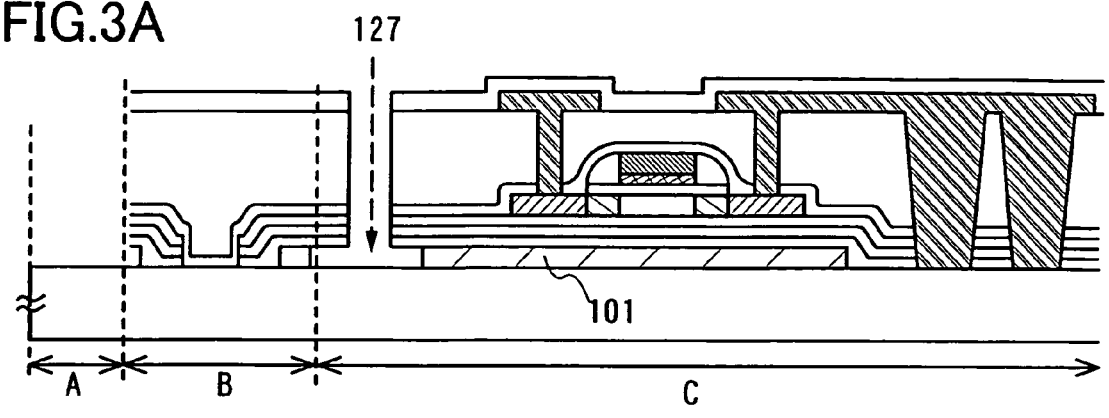
FIGS. 3A to 3D are views for showing a manufacturing process of a semiconductor device according to the present invention.

As shown in FIG. 3A, the peeling layer 101 is gradually diminished to be removed by introducing an etching agent 127 to the opening 126. In that case, the source electrode 120, the drain electrode 121, and the wiring 122 are not exposed since they are covered by at least the insulating film 111; therefore, they are not etched by the etching agent 127.

As the etching agent 127, gas or liquid containing halogen can be employed. As the gas or the liquid, halogen fluoride can be nominated, typically, chlorine trifluoride ($ClF_3$) can be used. $ClF_3$ can be produced by reacting chlorine to fluorine at 200° C. or more thorough the process of $Cl_2$ (g)+$3F_2$ (g) $2ClF_3$. As another gas containing halogen fluoride, gas formed by mixing nitrogen with $ClF_3$ or the like can be used.

$ClF_3$ may be liquid depending on temperature in a reaction space (boiling point 11.75° C.). As a liquid etching agent, liquid containing halogen fluoride, for example, HF can be used. A wet etching method can be employed.

An etching agent is not limited to $ClF_3$; any etching agent can be used as long as it etches the peeling layer 101 but does not etch the base insulating film 102, the insulating films 111, 112, and another insulating film. For example, a plasma gas containing fluorine such as $CF_4$, $SF_6$, $NF_3$, or $F_2$ can be used. Further, the liquid etching agent is not limited to the halogen fluoride; any etching agent can be used as long as it fulfills the foregoing conditions. As another etching agent, a strong alkaline solution such as tetraethylammonium hydroxide (TMAH) can be used.

In the case that the peeling layer 101 is chemically removed with gas containing halogen fluoride such as $ClF_3$, the combination of the peeling layer and the base insulating film is not limited to the above-described material as long as the material that is selectively etched is used for the peeling layer 101 and a material that is not etched is used for the base insulating film 102.

Even when attempting to remove the peeling layer 101, it is only selectively removed. The substrate 100 and the layer having a thin film transistor (which is also referred to as a layer to be released) are not completely separated from each other. As a result, a thin film transistor or the like is not flied away during transporting the substrate, and so the next process, that is, transporting the substrate 100 can be carried out easily.

As noted above, the substrate 100 can be separated by changing a crystalline state of oxide or the like of a material which can be used for the peeling layer 101. In that case, the substrate 100 and the layer having a thin film transistor or the like can be separated from each other with physical force as if peeling a seal.

The foregoing physical force can also be used in addition to the etching agent 127 which is used for removing the peeling layer 101.

Figure 3B:
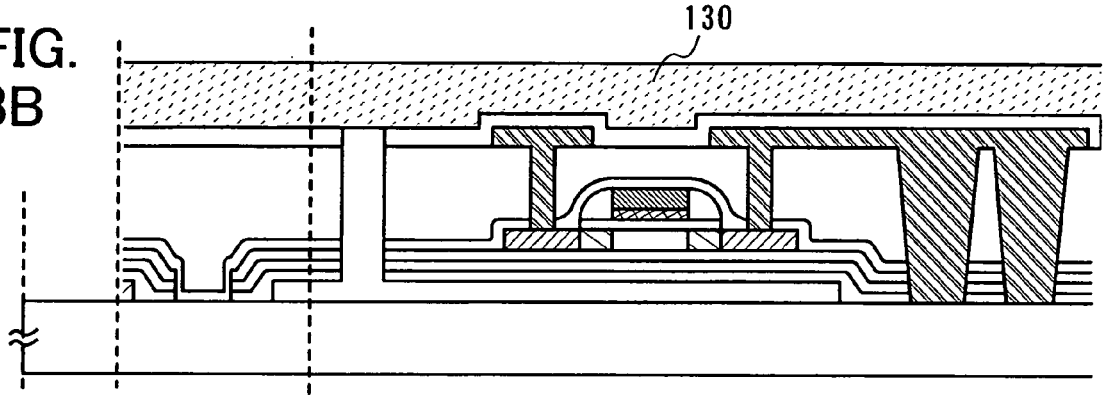

Thereafter, as shown in FIG. 3B, a different substrate 130 is adhered to the above the layer having a thin film transistor or the like. Accordingly, a plurality of thin film transistors can be integrated with each other.

Figure 3C:
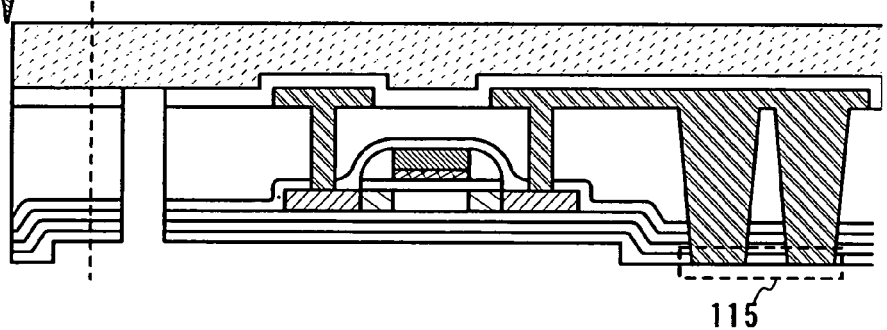

As shown in FIG. 3C, the substrate 100 is separated (also referred to as peeled). Since thin film transistors are integrated with each other by the different substrate 130, the thin film transistors or the like can be prevented from flying away.

When separating the substrate 100, a part of the wiring 122 is exposed on the surface which was provided with the substrate 100 in the region 115. In that case, a part of the wiring 122 is exposed in a large area, or a plurality of places in a limited area. As a result, connection of the conductive film or the like can be easily carried out and contact resistance can be reduced.

As the different substrate 130, a film (which is made from polypropylene, polyester, vinyl, polyvinyl fluoride, vinyl chloride, or the like), paper made from a fibrous material, a laminated film composed of a base material film (polyester, polyamide, inorganic vapor-deposited film, paper, or the like) and an adhesive synthetic resin film (acrylic synthetic resin, epoxy synthetic resin, or the like), or the like can be used. The film and a subject are sealed by thermocompression. The film can be adhered to the subject by melting an adhesive layer which is formed over a top most surface of the film or a layer which is formed over an outermost layer of the film and which is not the adhesive layer by heat treatment. That is, an adhesive layer is not necessarily formed over the surface of the different substrate 130. As the adhesive layer, an adhesive agent such as thermosetting resin, UV curing resin, epoxy resin adhesive agent, or resin additive can be used.

In the state, the glass substrate is divided into each semiconductor device by using a dividing means such as a scribing device, a laser irradiation device, a dicer device, a wire sawing device, or scissors. The glass substrate can be divided by human hands since they are integrated with each other by only the different substrate 130. At this time, the region B provided with the marker can be divided.

It is not necessarily divided into each one semiconductor device but an assemblage of a few semiconductor devices.

Figure 3D:
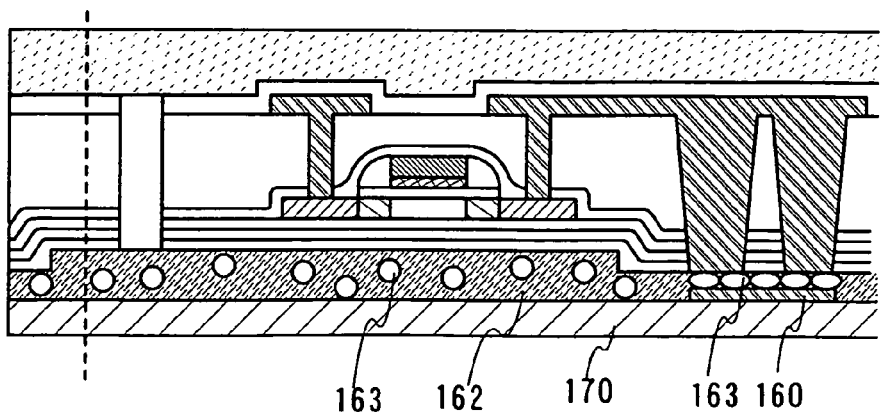

As shown in FIG. 3D, a part of the wiring 122 exposed after separating the substrate 100 is electrically connected to a conductive film 160 formed over a wiring substrate 170. In that case, restrictions in positioning for the connection is relieved since a part of the wiring 122 is exposed in a large area or at a plurality of positions in a limited area. Further, contact resistance between the wiring 122 and the conductive film 160 can be reduced.

The foregoing effect is also exerted on a bottom gate thin film transistor. That is, the foregoing effect can be brought about by exposing a part of the wiring 122 when peeling the substrate 100.

The wiring 122 can be connected to the conductive film 160 with an adhesive layer 162. As the adhesive layer 162, an adhesive agent such as thermosetting resin, UV curing resin, epoxy resin adhesive agent, or resin additive can be used. Conductive particles 163 are mixed into the adhesive layer 162 in order to keep electrical connection between the wiring 122 and the conductive film 160.

Figure 4A:
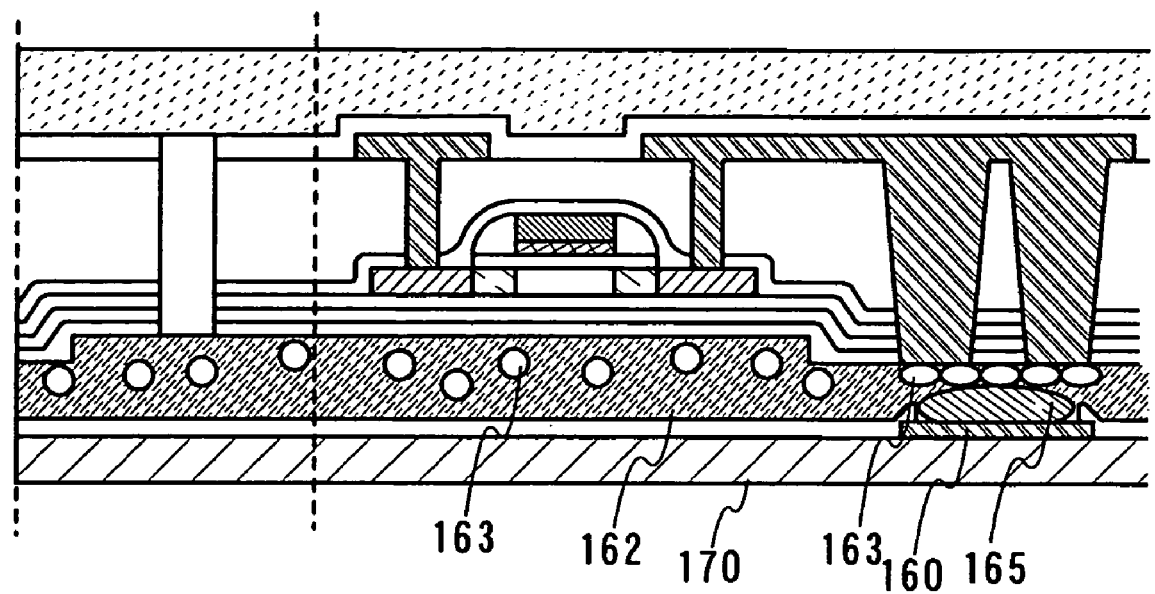
FIGS. 4A and 4B are views for showing a manufacturing process of a semiconductor device according to the present invention.

Besides the conductive particles 163, electrical connection between the wiring 122 and the conductive film 160 can be kept by bumps 165. In that case, as shown in FIG. 4A, the bumps 165 are formed between the wiring 122 and the conductive film 160, the wiring 122 and the conductive film 165 are pasted to each other with the adhesive layer 162 mixed with the conductive particles 163 over the wiring substrate 170 by separating the substrate 100.

Figure 4B:
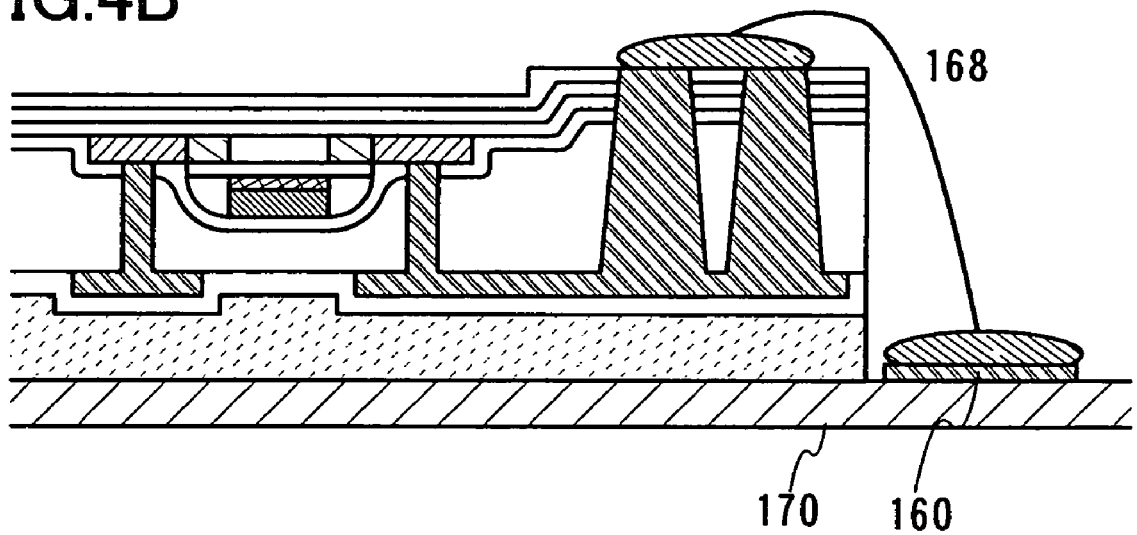

Besides the conductive particles 163, electrical connection between the wiring 122 and the conductive film 160 can be kept by a wire bonding method. In that case, as shown in FIG. 4B, the surface on which the wiring 122 is exposed is turned around and provided over the wiring substrate 170 by separating the substrate 100, and the exposed wiring is connected to the conductive film 160 with a wire 168. Thereafter, the semiconductor device can be packaged by a known method.

As the wiring substrate 170, a thin and light plastic substrate having flexibility can be used. Specifically, a substrate made from polyethylene terephthalate (PET), polyethylene naphthalate (PEN), polyether sulfone (PES), polypropylene, polypropylene sulfide, polycarbonate, polyetherimide, polyphenylene sulfide, polyphenylene oxide, polysulfone, polyphthalamide, or the like.

Figure 6A:
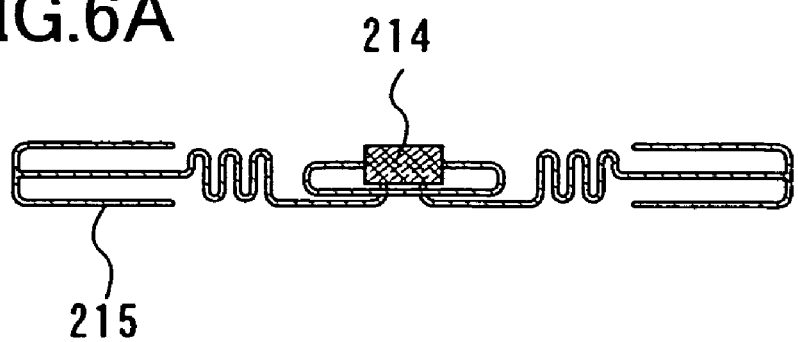
FIGS. 6A and 6B are views for showing antennas mounted to a semiconductor device according to the present invention.
Figure 6B:
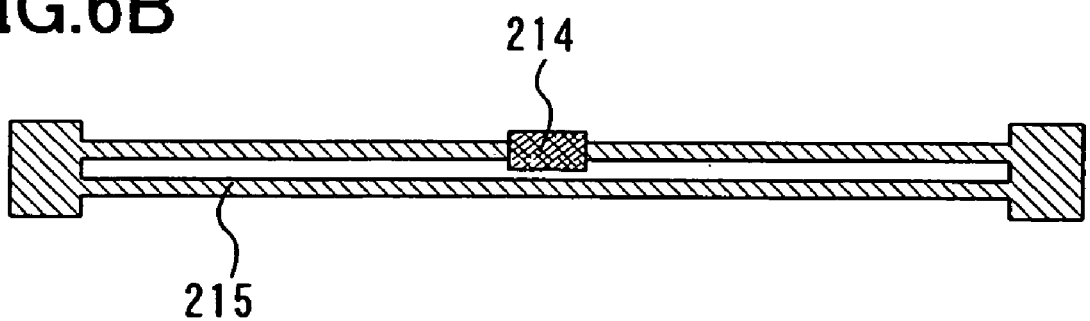

In this embodiment, the wiring substrate 170 is provided with an antenna including a part of the conductive film 160. The antenna is not limited to the form in a roll. The shape of the antenna may be either a curved form (refer to FIG. 6A) or a straight line shape (refer to FIG. 6B). FIGS. 6A and 6B show an antenna 215 is connected to a thin film integrated circuit 214.

A semiconductor device which performs wireless communication (also referred to as a wireless chip) is completed by mounting an antenna. The wireless chip can be referred to as a wireless processor, a wireless memory, or a wireless tag according to usages. A card mounted with a wireless chip can be referred to as an IC card.

A chip which does not have an antenna is included in a category of the semiconductor device according to the present invention. That is, an antenna is not necessarily mounted according to the present invention. Although the case that the antenna formed over the wiring substrate 170 is explained, the antenna can be directly formed on the wiring 122. The semiconductor device can be mounted with a plurality of antennas, and can have the antenna formed over the wiring substrate 170 and the antenna formed on the wiring 122.

Figure 5:
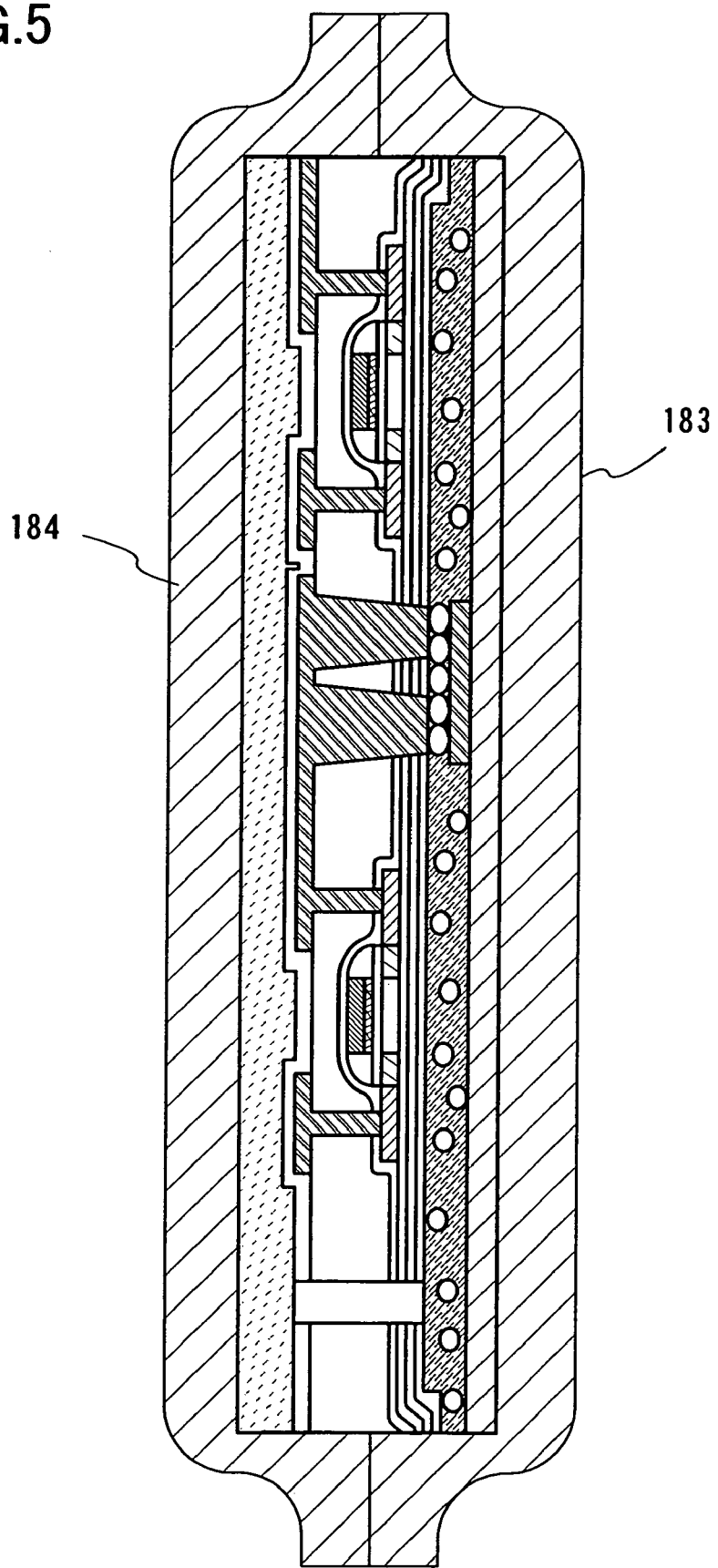
FIG. 5 is a cross-sectional view for showing sealing processing.

Both surfaces of the completed semiconductor device can be covered by films 183, 184 (preferably, resin films) in order to perform a sealing process (refer to FIG. 5). By the process, strength of the semiconductor device can be increased and portability is improved. The foregoing process can be performed by a sequence of processes, and so hours of work can be reduced. For example, the wiring substrate 170 is used as the film 183 and the conductive film 160 such as an antenna is printed on the film 183. A layer having a thin film transistor or the like which is transferred over the different substrate 130 is pasted onto the film provided with an antenna or the like. In that case, the layer having a thin film transistor transferred over the different substrate 130 is winded around a roll but not divided into each semiconductor device, and pasted onto the film 183 sequentially. Simultaneously, the film 184 is pasted over the different substrate 130. At this time, a part of the wiring 122 and the conductive film 160 can be electrically connected to each other by bonding the periphery such as the films 183, 184 to each other. Thereafter, the substrate is divided into each semiconductor device.

In this state, a total thickness of the thin film transistor, the antenna, and a protective layer becomes 20 to 40 µm, and each thickness of a first substratum 51 and a second substratum 52 is 15 to 35 µm.

The semiconductor device according to the present invention is formed over the wiring substrate 170, that is, a film substrate.

The semiconductor device has a semiconductor film with a thickness of 0.2 nm or less, typically, 40 to 170 nm, preferably, 50 to 150 nm as an active region. Therefore, an extremely light and thin semiconductor device can be provided.

In this embodiment, the case that the thin film transistor is transferred directly over the wiring substrate 170 is explained; however, the present invention is not limited thereto. For example, the thin film transistor can be transferred directly to a product or a label instead of the wiring substrate 170. A product label or a product tug mounted with a semiconductor device can be manufactured by transposing directly over the board of a label paper or a tug. In the case of manufacturing the product label or the product tug, a semiconductor device mounted with an antenna is preferably used since processing can be performed by wireless communication and much processing can be performed at once.

According to the present invention, contact can be checked with a part of the wiring 122 which is exposed when separating the substrate 100. Checking the contact is easy and is preferable since it does not require a complicate device.

In the case that a semiconductor device is formed from a rectangular substrate such as the substrate 100, the shape of a mother substrate is not limited compared to the case that a semiconductor device is formed from a circular silicon wafer. Therefore, productivity can be increased and mass production can be carried out. As a result, the cost of the semiconductor device can be reduced. A semiconductor device of which unit value is extremely low can generate vast profits by further reducing the cost of unit value.

The semiconductor device according to the present invention is in no danger of radio wave absorption and performs highly sensitive signal reception.

Since the semiconductor device according to the present invention does not have a silicon wafer, it has a light-trans-

Embodiment 2

In this embodiment, a thin film transistor having a different structure than that of the thin film transistor explained in the foregoing embodiment is explained.

Figure 7:
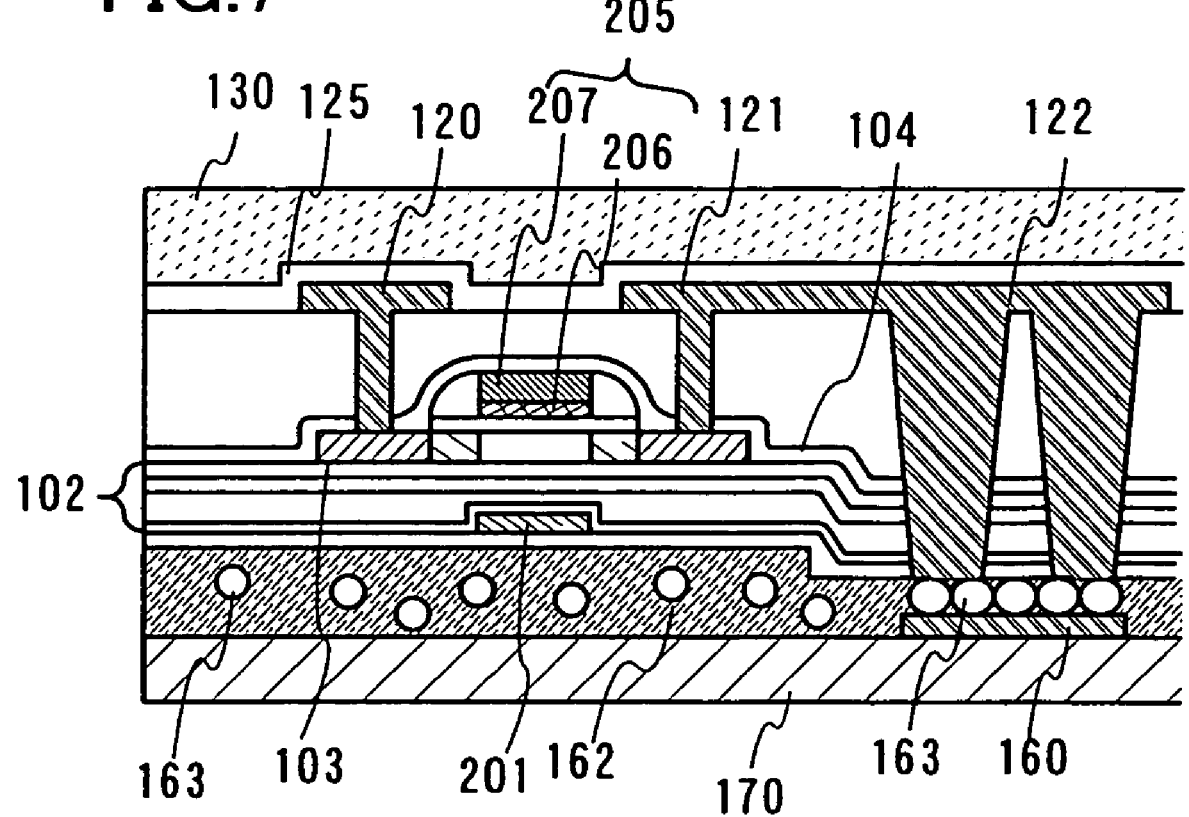
FIG. 7 is a view for showing a structure of a thin film transistor applied to a semiconductor device according to the present invention.

The structure of a thin film transistor can be a dual gate type in which a semiconductor film is interposed between gate electrodes (the gate electrodes are referred respectively to as a top gate electrode and a bottom gate electrode) besides a top gate type in which a gate electrodes is formed over a semiconductor film as explained in the foregoing embodiment. In this embodiment, the structure of a dual gate thin film transistor in which the thin film transistor is pasted over a wiring substrate 170 via an adhesive layer 162 is explained with reference to FIG. 7.

A conductive film serving as a bottom gate electrode 201 is formed over a peeling layer 101 via an insulating film. A material, a manufacturing method, and a structure of the bottom gate electrode 201 can be referred to the gate electrode 105 in the foregoing embodiment. Since the bottom gate electrode 201 having a fine gate width is formed, a thin resist mask can be used to perform an etching process which is the same as in the case of the foregoing embodiment.

Then, an insulating film serving as a base insulating film 102 is formed. A material, a manufacturing method, and a structure of the insulating film can be referred to the base insulating film 102 in the foregoing embodiment. An impurity from the substrate 100 or the substrate 170 in the case of after transposition, and a gate material from the bottom gate electrode 201 can be prevented from dispersing to the semiconductor film 103.

As with the foregoing embodiment, an island semiconductor film 103 having a predetermined shape, a gate insulating film 104 covering the semiconductor film 103, and a conductive film serving as a top gate electrode 205 are provided sequentially. Materials and manufacturing methods of the foregoing films can be referred to the foregoing embodiment.

A resist mask is formed to process the conductive film into a predetermined shape of the top gate electrode 205. In that case, a resist mask which has a predetermined shape can be formed by exposure of a reverse face using the bottom gate electrode 201. Then, the conductive film can be processed into the predetermined shape of the top gate electrode 205. By the exposure of the resist mask with the bottom gate electrode 201, the accuracy of positioning the bottom gate electrode 201 can be improved.

As explained in the foregoing embodiment, in the case that the top gate electrode 205 is formed to have a laminated structure, the resist mask which is exposed by using the bottom gate electrode 201 is used to process a bottom layer electrode 206 of the top gate electrode. Thereafter, a top layer electrode 207 is formed.

After forming the top gate electrode 205 as noted above, an impurity region is formed by adding an impurity element to the semiconductor film 103 with the top gate electrode 205. In that case, an insulator 110 serving as a side wall can be provided as with the foregoing embodiment to form a low concentration impurity region and a high concentration impurity region.

In the case that the top gate electrode 205 is formed to have a lamination structure, a low concentration impurity region and a high concentration impurity region can be formed by using the top layer electrode 207 and the bottom layer electrode 206. In that case, the low concentration impurity region is overlapped with the bottom layer electrode 206, and so a so-called GOLD structure is formed.

In order to control separately the bottom gate electrode 201 and the top gate electrode 205, wirings are connected to each of the electrodes respectively. Firstly, a contact hole is formed by removing a part of the top gate electrode 205 to provide a wiring which is connected to the bottom gate electrode 201. In the case that the top gate electrode 205 is formed to have a laminate structure composed of a bottom layer electrode and a top layer electrode, only a part of the bottom layer electrode may be removed.

In the case of controlling equally the bottom gate electrode 201 and the top gate electrode 205, a part of the top gate electrode 205 is not required to be removed as noted above. An opening is formed at the insulting film 104 formed over the gate electrode 201 and the top gate electrode 205 is formed directly at the opening.

Thereafter, an insulating film 211 is formed to cover the top gate electrode 205, the gate insulating film 104, and the like. A material, a manufacturing method, a structure of the insulating film 211 can be referred to the insulating film 111 in the foregoing embodiment.

In order to form a wiring connecting to the impurity region, an opening is formed at the insulating film 211, the gate insulating film 104, and the like. Simultaneously with forming an opening so that an impurity region which is a part of the semiconductor film is exposed, an opening is formed at a predetermined region, for example, between the selectively formed peeling layers 101 so that the substrate 100 is exposed. A method for manufacturing the opening can be referred to the foregoing embodiment. In this process, the peeling layer 101 is made not to be exposed since there is a threat that the peeling layer 101 is etched by etching the conductive film formed at a certain opening potion in the subsequent process. Therefore, the peeling layer 101 can be exposed in the case of obtaining a selective ratio between the peeling layer and the conductive layer formed at the opening.

Thereafter, a source electrode 120 or a drain electrode 121, each of which is connected to the impurity region can be formed by processing the conductive film into a predetermined shape. After forming the source electrode 120 and the drain electrode 121, a thin film transistor can be completed. Further, a circuit structured by putting together a plurality of thin film transistors is referred to as a thin film integrated circuit.

Simultaneously, a wiring 122 which is connected to the source electrode or the drain electrode can be formed at the opening on which the substrate 100 is exposed. The wiring 122 is formed so as to be partly in contact with the substrate 100. A region where the wiring 122 is partly in contact with the substrate 100 is preferably between the peeling layers 101 and between islands like semiconductor films. According to the present invention, the region where the wiring 122 is partly in contact with the substrate 100 is enlarged as much as possible or provided at a plurality positions in a limited area.

Thereafter, an insulating film 125 covering the source electrode 120, the drain electrode 121, and the wiring 122 can be formed. A material, a manufacturing method, and a structure of the insulating film 125 can be referred to the foregoing embodiment.

Subsequently, a part of the wiring 122 which is exposed after separating the substrate 100 is electrically connected to the conductive film 160 which is formed over the wiring substrate 170. Since a part of the wiring 122 is exposed in a large area or at a plurality of positions in a limited area, restrictions on positioning for the connection can be relieved.

Further, the wiring 122 is provided in a large area or a plurality of positions, and so contact resistance of the conductive film 160 can be reduced.

Materials, manufacturing methods, and structures of the wiring substrate 170 and the conductive film 160 formed over the wiring substrate 170 can be referred to the foregoing embodiment. The conductive film 160 can serve as an antenna.

As noted above, a semiconductor device including a dual gate thin film transistor having the bottom gate electrode 201 can be completed.

A dual gate thin film transistor can be applied to a logistic circuit of a semiconductor device. The bottom gate electrode 201 can be controlled separately from the top gate electrode 205. Therefore, in the case that the gate electrode, especially, the top gate electrode 205 forms a fine thin film transistor, it is possible to turn into an OFF state by controlling the bottom gate electrode 201 even if current is flown when inputting a signal to be OFF into the top gate electrode 205. As a result, electric consumption can be reduced.

Specifically, in the case that an n-type thin film transistor is formed to be a dual gate type, a leak current can be reduced by increasing a threshold voltage when applying a negative bias voltage against the bottom gate electrode 201. Further, application of a positive bias voltage can make current easy to flow in a channel formation region by decreasing a threshold voltage. Therefore, the dual gate thin film transistor can operate at higher speed or lower voltage.

This embodiment can be freely combined with the foregoing embodiment.

Embodiment 3

In this embodiment, a logistic circuit included in a semiconductor device is explained. The logistic circuit is structured by thin film transistors, and so it can be referred to as a thin film integrated circuit. The logistic circuit according to this embodiment has a function of reading out data within a mask ROM according to a read out instruction from a reader/writer. The semiconductor device is a vicinity type, communication signal frequency is 13.56 MHz, a data transmission rate of sending is approximately 13 kHz, and Manchester code is used as a way of encoding.

Figure 8:
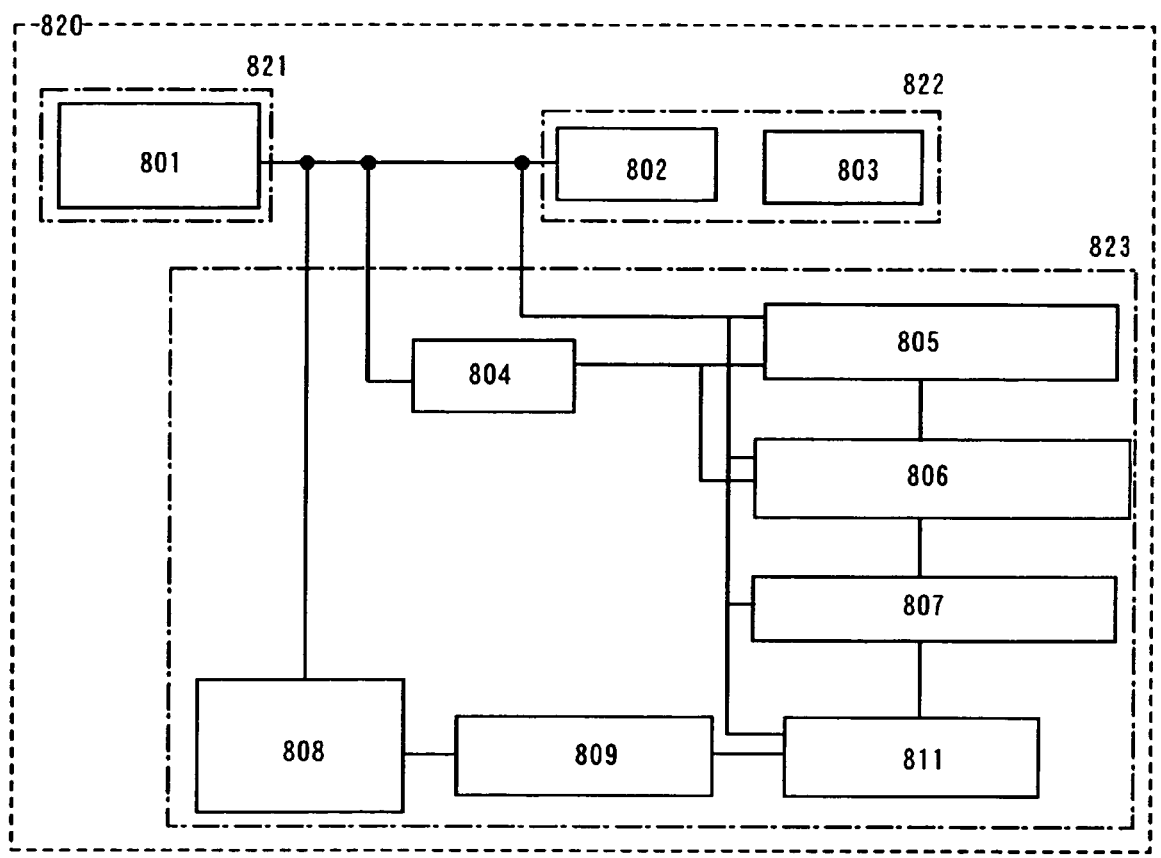
FIG. 8 is a view for showing a circuit structure of a semiconductor device according to the present invention.

As shown in FIG. 8, a logistic circuit 820 is composed roughly of an antenna unit 821, a power source unit 822, and a logic unit 823. The antenna unit 821 has an antenna circuit 801 or resonance capacitance for receiving an external signal and sending data. The antenna circuit receives an electromagnetic wave which is output from the reader/writer and produces an alternating signal. The alternating signal is inputted to a power source unit 822 directly or via a capacitor element. The power source unit 822 has a rectifier circuit 802 for producing a power source by the alternating signal and a retention volume 803 for holding a produced power source. The logic unit 223 has a demodulator circuit 804 for demodulating a received signal, a clock controller 805 for generating a clock signal, each code recognition and determination circuit 806, a memory controller 807 for producing a signal which reads out data from a memory by the received signal, a modulation circuit and resistance 808 for putting an encoded signal on the received signal, an encoding circuit 809 for encoding data which is read out, and a mask ROM 811 for holding data.

The demodulation circuit 804 demodulates an instruction code in an alternating signal. The clock controller 805 has functions of generating a clock based on the alternating signal and correcting the clock. A reading out code of the demodulated signal is recognized by the each code recognition and determination circuit 806. The codes which are recognized and determined by the each code recognition and determination circuit 806 are an end of frame (EOF) signal, a start of frame (SOF) signal, a flag, a command code, a mask length, a mask value, and the like. The each code recognition and determination circuit 806 has a function of cyclic redundancy check (CRC) for identifying a send error. The result from the each code recognition and determination circuit 806 is output to the memory controller 807. The memory controller 807 controls reading out of the mask ROM 811 based on a determination result. Data read out from the mask ROM 811 is encoded in the encoding circuit 809 and modulated in the modulation circuit and resistance 808.

As a means for holding data, at least one memory selected among a DRAM (Dynamic Random Access Memory), an SRAM (Static Random Access Memory), an FRAM (Ferroelectric Random Access Memory), a PROM (Programmable Read Only Memory), an EPROM (Electrically Programmable Read Only Memory), an EEPROM (Electrically Erasable Programmable Read Only Memory), and a flash memory.

An example of a layout of a logistic circuit having the foregoing structure is explained.

Figure 9A:
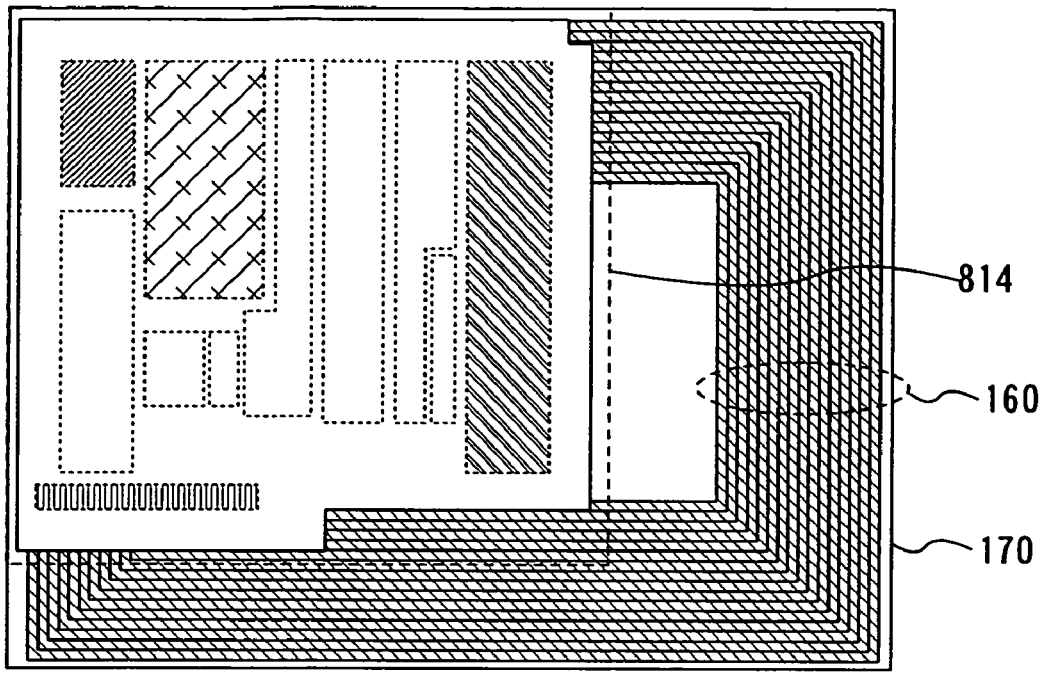
FIGS. 9A and 9B are views for showing a structure of a semiconductor device according to the present invention.

A layout of one semiconductor device is explained as shown in FIG. 9A. The semiconductor device is formed by bonding a wiring substrate 170 provided with a conductive film 160 serving as an antenna and a thin film integrated circuit 814 for constituting a power source 822 and a logic circuit 823. A region in which the thin film integrated circuit 814 is formed and a region where the antenna is formed are partly overlapped with each other. In the structure of the semiconductor device shown in FIG. 9A, the conductive film 160 for constituting the antenna has a width of 150 μm, a distance between the conductive layers is 10 μm, the number of windings is 15. As noted above, the shape of the antenna is not limited to a rolled form; it can have shapes as shown in FIGS. 6A and 6B.

Figure 9B:
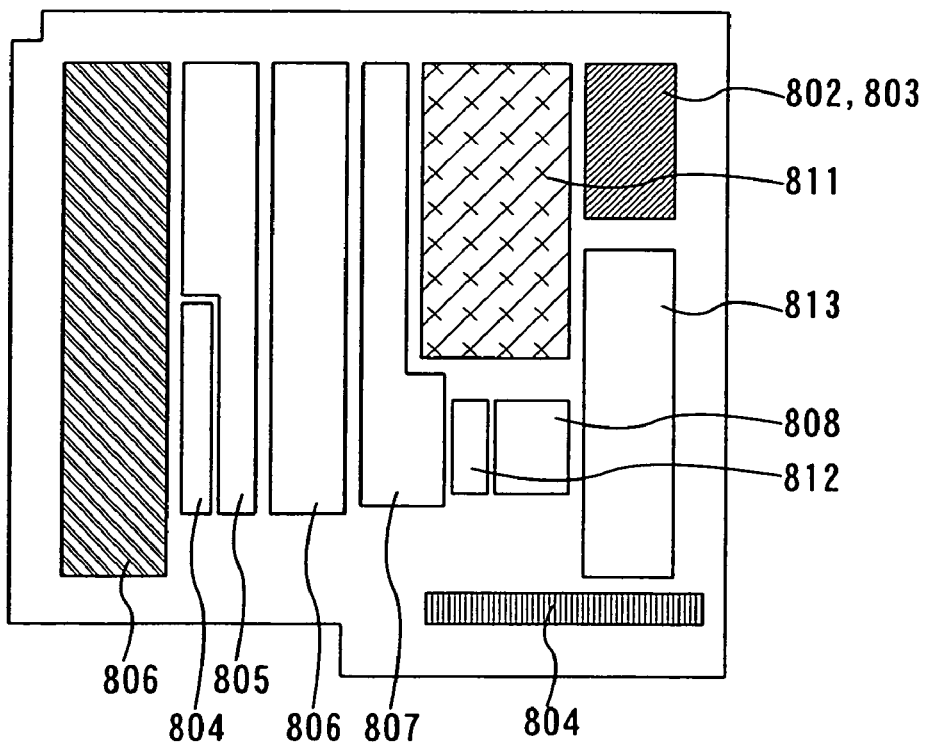

Layouts of the power source unit 822 and the logic unit 823 are explained with reference to FIG. 9B. The rectifier circuit 802 for constituting the power source unit 822 and the retention volume 803 are provided at the same region. The retention volume can be formed by using a thin film transistor.

The demodulation circuit 804 for constituting the logic unit 823 and the each code recognition and determination circuit 806 can be respectively provided at two positions by dividing into two. The mask ROM 811 is preferably provided adjacent to the memory controller 807. The demodulation circuit 804 is provided between the clock controller 805 and the each code recognition and determination circuit 806.

Although not shown in a block diagram in FIG. 9, detection capacity 812 for a logic unit and detection capacity 813 for a power source unit are provided. The modulation circuit and resistance 808 can be provided between the detection capacity 812 and the detection capacity 813.

Information is built into a mask ROM 811 in a manufacturing process. Here, two power source lines of a power source line connected to a high potential power source (also referred to as VDD) and a power source line connected to a low potential power source (also referred to as VSS) are provided. Information recorded in a memory cell is determined depending on which the foregoing power source lines is connected to a transistor included in each memory cell. Information which is built in a manufacturing process will remain unchanged.

As a frequency band of an electric wave employed by a semiconductor device having such the logistic circuit, any band can be used among a long wave band of ~135 kHz, short wave bands of 6.78 MHz, 13.56 MHz, 27.125 MHz, 40.68 MHz, and 5.0 MHz, micro wave bands of 2.45 GHz, 5.8 GHz, and 24.125 GHz, and the like. Either of an electromagnetic induction type or a radio wave communication type can be used for electromagnetic wave transmission.

Embodiment 4

Figure 10A:
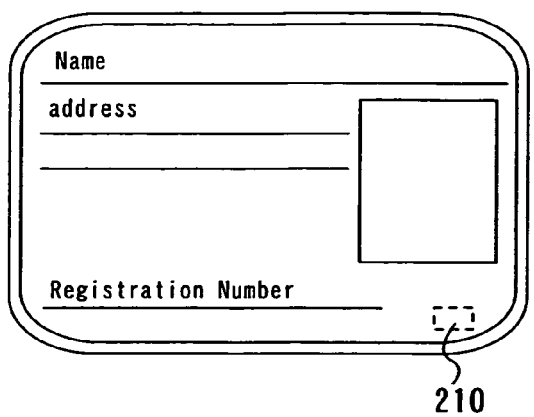
FIGS. 10A to 10E are views for showing products applied with a semiconductor device according to the present invention.
Figure 10B:
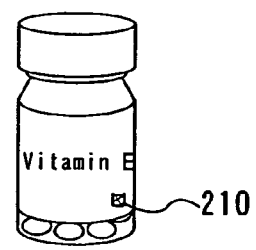
Figure 10C:
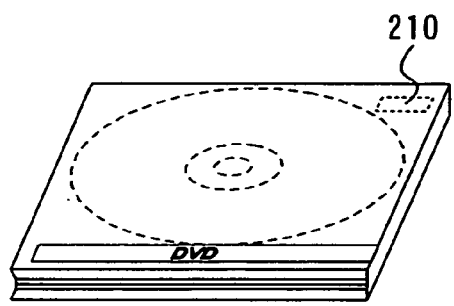
Figure 10D:
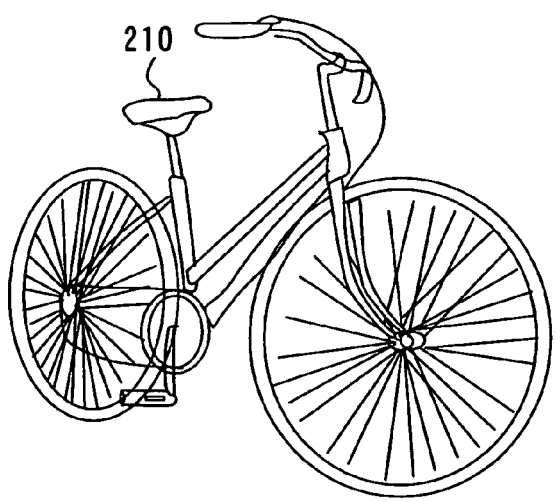
Figure 10E:
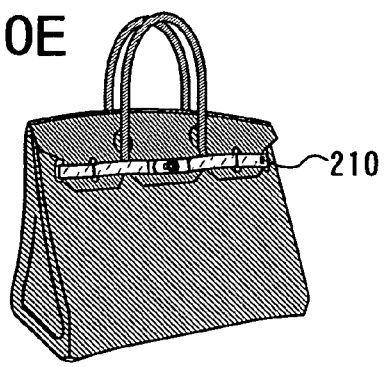

The usage of the semiconductor device manufactured according to the present invention is wide-ranging. Specific examples of usage are explained as follows. For example, the semiconductor device can be provided to paper money, coins, securities, bearer bonds, certificates (driver's license, residence certificate, and the like appearing in FIG. 10A), packing containers (wrapping paper, a bottle, and the like appearing in FIG. 10B), a recording medium (DVD software, a video tape, and the like appearing in FIG. 10C), vehicles (a bicycle and the like appearing in FIG. 10D), commodities (a bag, glasses, and the like appearing in FIG. 10E), foods, plants, animals, human bodies, garments, livingware, electronic appliances, and the like. The electronic appliances represent a liquid crystal display device, an EL display device, a television device (also referred to as TV, TV receiver, or television receiver), a cellular phone, and the like.

The semiconductor device is fixated to products by pasting over the surfaces of the products or embedding in the products. For example, the semiconductor device is embedded in a paper of a book or in organic resin of a package made from the organic resin. Since the semiconductor device according to the present invention is realized to be small, thin, and lightweight, design of a product is not detracted after fixating the semiconductor device to the product. A certification function can be provided by providing the semiconductor device according to the present invention to the paper money, the coins, the securities, the bearer bonds, the certificates, and the like. A counterfeit can be prevented by employing the certification function. The efficiency in an inspection system can be promoted by providing the semiconductor device to the packing containers, the recording medium, the commodities, the foods, the garment, the livingware, the electronic appliances, and the like.

Figure 11A:
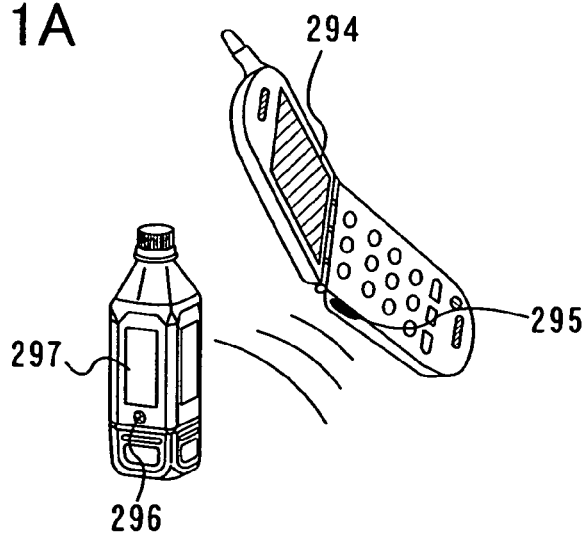
FIGS. 11A and 11B are views for showing modes of products applied with a semiconductor device according to the present invention.
Figure 11B:
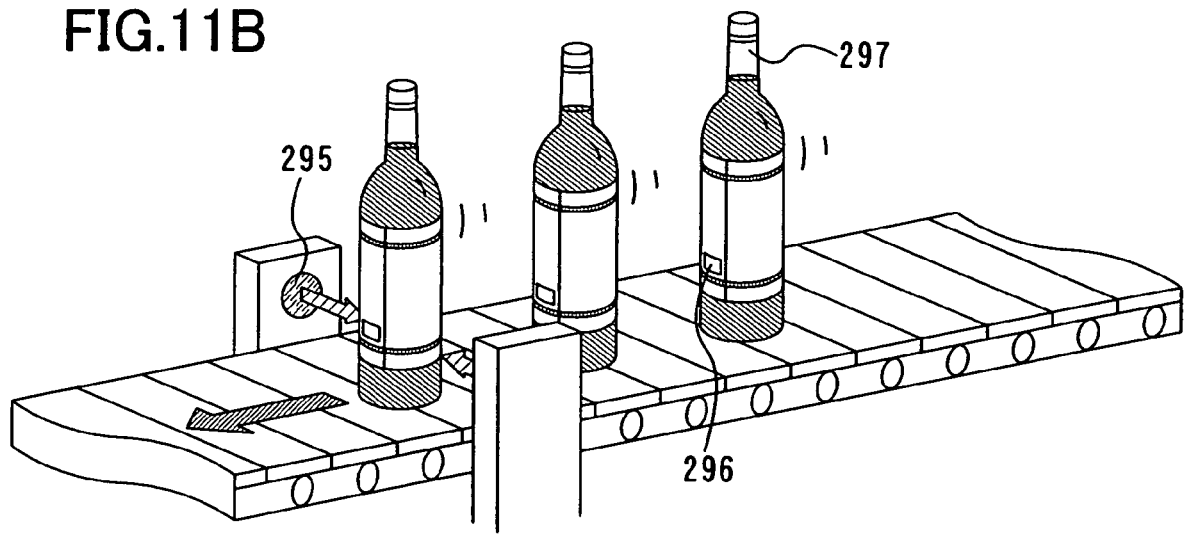

An example of employing the semiconductor device according to the present invention is explained. A reader/writer 295 is provided to the side face of a portable terminal having a display portion 294 and a semiconductor device 296 is provided to the side face of a product 297 (refer to FIG. 11A). Information on the raw material, the place of origin, distribution process, and the like of the product 297 is preliminarily stored in the semiconductor device 296. In case that it is possible that information included in the semiconductor device 296 can be displayed on the display portion 294 when the reader/writer 295 is held over the semiconductor device 296, a system which is superior in convenience can be provided. Alternatively, there is the case that the reader/writer 295 is provided to the side of a belt conveyor (refer to FIG. 11B). In that case, a system in which inspection of the product 297 can be carried out easily can be provided. By employing the semiconductor device according to the present invention for management of products or a system for logistics, a system can be sophisticated and improved its convenience.

Figure 12A:
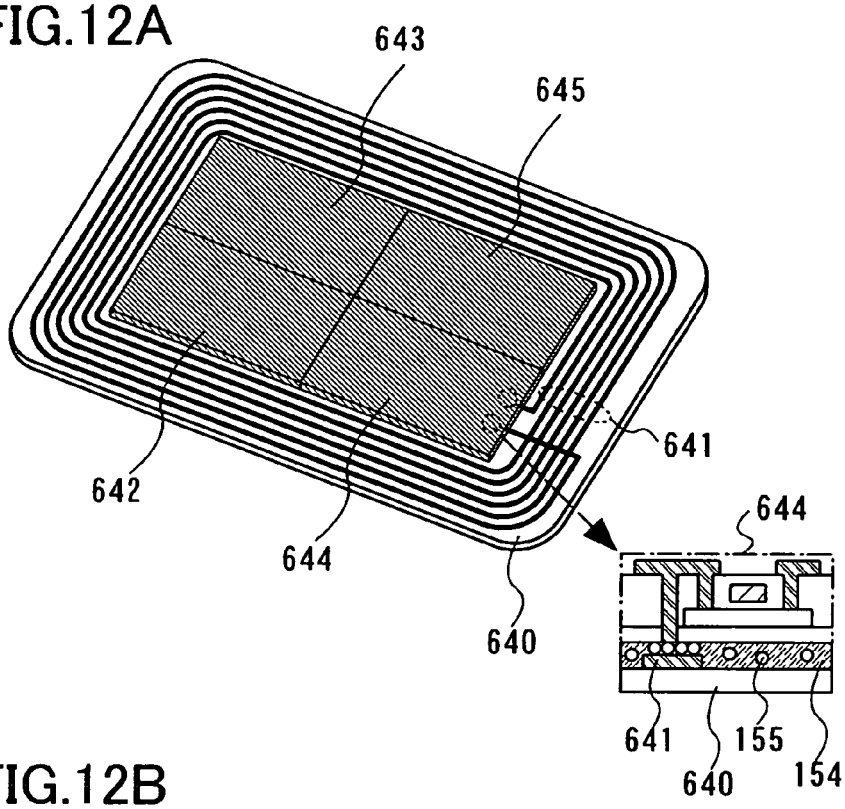
FIGS. 12A to 12C are views for showing a card applied with a semiconductor device according to the present invention.

A semiconductor device serving as an IC card is explained (refer to FIG. 12A). Thin film integrated circuits 642 to 645 are attached to the surface of a substrate 640. The conductive layer 641 over the substrate 640 and a connection conductive layer on the backside of the thin film integrated circuit 644 are attached to each other with a resin 154 containing conductive particles 155. Each of the thin film integrated circuits 601 to 604 serves as one or a plurality of Central Processing Unit (CPU), memory, a network processing circuit, a disk processing circuit, an image processing circuit, an audio processing circuit, a power supply circuit, a temperature sensor, a humidity sensor, an infrared sensor, and the like. Since the semiconductor device having the foregoing structure has the conductive layer 641 serving as an antenna and a plurality of the thin film integrated circuits 642 to 645, a wireless chip with high performance can be provided. Therefore, complicated processing such as encryption processing can be carried out and a sophisticated IC card can be provided.

Figure 12B:
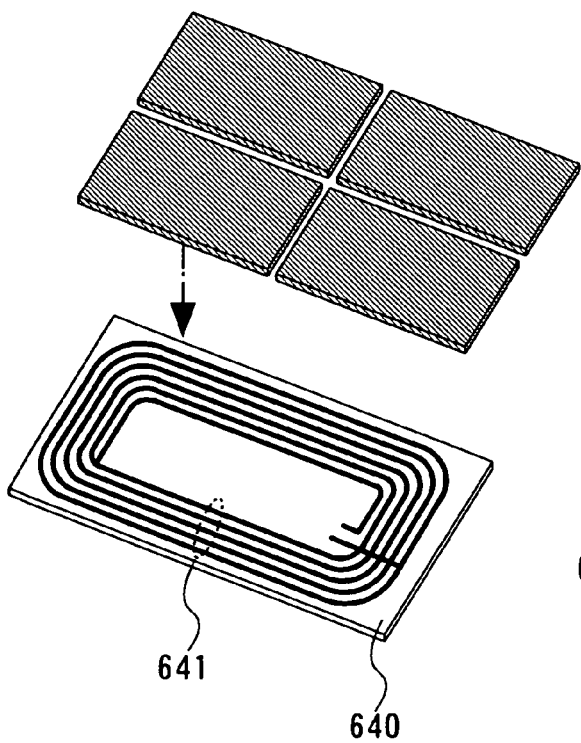
Figure 12C:
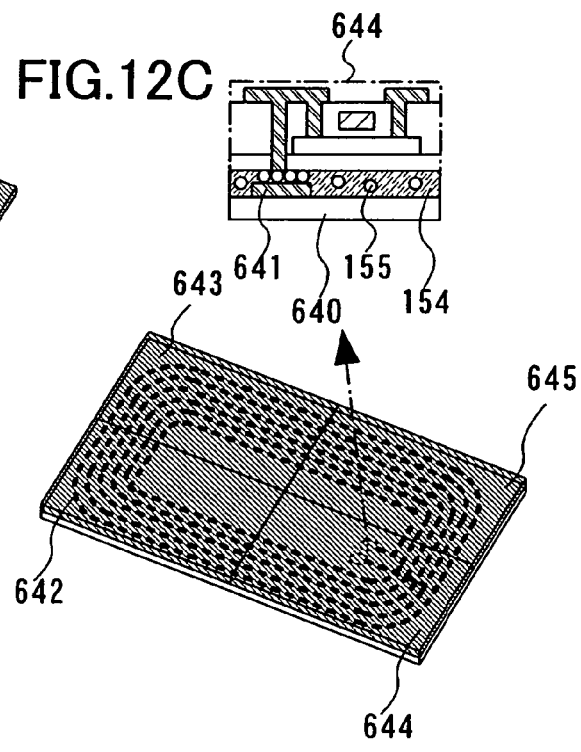

Note that, in a structure shown in FIG. 12A, the conductive layer 641 serving as an antenna is provided in the periphery of the thin film integrated circuits 642 to 645. However, the invention is not limited to this mode. Thin film integrated circuits 642 to 645 may be provided to overlap with a conductive layer 641 serving as an antenna (refer to FIGS. 12B and 12C). Accordingly, a small, thin, and lightweight wireless chip can be provided by reducing the area of the substrate 640. In such a semiconductor device which realizes downsizing, body temperature can be measured by, for example, applying a temperature sensor to any one of the thin film integrated circuits 642 to 645 to be attached to skin of a human body (preferably, forehead skin).

A thin film integrated circuit included in the semiconductor device according to the present invention is realized to be small, thin, and lightweight, and so the electronic equipment mounted with the semiconductor device can be more sophisticated and increased its added value.

This application is based on Japanese Patent Application serial no. 2004-338229 filed in Japan Patent Office on Nov. 22, 2004 the contents of which are hereby incorporated by reference.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A method for manufacturing a semiconductor device comprising:
    forming selectively a peeling layer over a first substrate;
    forming a layer having a plurality of thin film transistors over the peeling layer;
    forming a first opening so that a part of a semiconductor film of the thin film transistors is exposed and forming a second opening in the peeling layer so that the first substrate is exposed;
    forming a first conductive film at the first opening and the second opening;
    processing the first conductive film to form a source or drain electrode at the first opening and to form a wiring at the second opening;
    forming a third opening so that the peeling layer is exposed;
    introducing an etching agent into the third opening and removing the peeling layer to separate the layer having the plurality of thin film transistors from the first substrate; and
    pasting the layer having the plurality of thin film transistors onto a second substrate so that the wiring and a second conductive film provided over the second substrate are electrically connected to each other through a plurality of places.

2. A method for manufacturing a semiconductor device comprising:
   forming selectively a peeling layer over a first substrate;
   forming a layer having a plurality of thin film transistors over the peeling layer;
   forming a first opening so that a part of a semiconductor film of the thin film transistors is exposed and forming a plurality of second openings in the peeling layer so that the first substrate is exposed;
   forming a first conductive film at the first opening and at the second openings;
   processing the first conductive film to form a source or drain electrode at the first opening and to form a wiring at the second openings;
   forming a third opening so that the peeling layer is exposed;
   introducing an etching agent into the third opening and removing the peeling layer to separate the layer having the plurality of thin film transistors from the first substrate; and
   pasting the layer having the plurality of thin film transistors onto a second substrate so that the wiring and a second conductive film provided over the second substrate are electrically connected to each other.

3. A method for manufacturing a semiconductor device comprising:
   forming selectively a peeling layer over a first substrate;
   forming a layer having a plurality of thin film transistors over the peeling layer;
   forming a first opening so that a part of a semiconductor film of a first thin film transistor of the thin film transistors is exposed and forming a second opening between the first thin film transistor and a second thin film transistor adjacent to the first thin film transistor so that the first substrate is exposed;
   forming a first conductive film at the first opening and at the second opening;
   processing the first conductive film to form a source or drain electrode at the first opening and to form a wiring at the second opening;
   forming a third opening so that the peeling layer is exposed;
   introducing an etching agent into the third opening and removing the peeling layer to separate the layer having the plurality of thin film transistors from the first substrate; and
   pasting the layer having the plurality of thin film transistors onto a second substrate so that the wiring, and a second conductive film provided over the second substrate are electrically connected to each other through a plurality of places.

4. A method for manufacturing a semiconductor device comprising:
   forming selectively a peeling layer over a first substrate;
   forming a layer having a plurality of thin film transistors over the peeling layer;
   forming a first opening so that a part of a semiconductor film of a first thin film transistor of the plurality of thin film transistors is exposed and forming a plurality of second openings between the first thin film transistor and a second thin film transistor adjacent to the first thin film transistor so that the first substrate is exposed;
   forming a first conductive film at the first opening and at the second openings;
   processing the first conductive film to form a source or drain electrode at the first opening and to form a wiring at the second openings;
   forming a third opening so that the peeling layer is exposed;
   introducing an etching agent into the third opening and removing the peeling layer to separate the layer having the plurality of thin film transistors from the first substrate; and
   pasting the layer having the plurality of thin film transistors onto a second substrate so that the wiring and a second conductive film provided over the second substrate are electrically connected to each other.

5. A method for manufacturing a semiconductor device comprising:
   forming selectively a peeling layer over a first substrate
   forming a base insulating film over the peeling layer;
   removing a part of the base insulating film at a periphery of the first substrate;
   forming a semiconductor film over the base insulating film;
   removing a part of the semiconductor film at the periphery of the first substrate;
   forming a marker at the semiconductor film without exposing the peeling layer;
   emitting a laser to the semiconductor film by employing the marker;
   processing the semiconductor film to form a first island like semiconductor film;
   forming a gate insulating film and a gate electrode sequentially over the first island like semiconductor film;
   adding an impurity to a part of the first island like semiconductor film by using the gate electrode to form an impurity region;
   forming a first opening so that the impurity region is exposed and forming a second opening in the peeling layer so that the first substrate is exposed;
   forming a first conductive film at the first opening and at the second opening;
   processing the first conductive film to form a source or drain electrode at the first opening and to form a wiring at the second opening;
   forming a third opening so that the peeling layer is exposed;
   introducing an etching agent into the third opening and removing the peeling layer to separate a layer having a plurality of thin film transistors comprising the first and second island like semiconductor films from the first substrate; and
   pasting the layer having the plurality of thin film transistors onto a second substrate so that the wiring and a second conductive film provided over the second substrate are electrically connected to each other.

6. The method for manufacturing a semiconductor device according to claim 5, wherein laser irradiation is performed with continuous-wave laser.

7. The method for manufacturing a semiconductor device according to claim 5, further comprising leaving the semiconductor film over the peeling layer so that the marker is formed at the semiconductor film without exposing the peeling layer.

8. The method for manufacturing a semiconductor device according to claim 5, further comprising forming the marker at a film other than the semiconductor film over the peeling layer so that the marker is formed at the semiconductor film without exposing the peeling layer.

9. The method for manufacturing a semiconductor device according to claim 6, further comprising leaving the semiconductor film over the peeling layer so that the marker is formed at the semiconductor film without exposing the peeling layer.

10. The method for manufacturing a semiconductor device according to claim 6, further comprising forming the marker at a film other than the semiconductor film over the peeling layer so that the marker is formed at the semiconductor film without exposing the peeling layer.

11. A method for manufacturing a semiconductor device comprising:
   forming selectively a peeling layer over a first substrate;
   forming a base insulating film over the peeling layer;
   removing a part of the base insulating film at a periphery of the first substrate;
   forming a semiconductor film over the base insulating film;
   removing a part of the semiconductor film at a periphery of the first substrate;
   forming a marker at the semiconductor film without exposing the peeling layer;
   emitting a laser to the semiconductor film by employing the marker;
   processing the semiconductor film to form a first island like semiconductor film and a second island like semiconductor film adjacent to the first island like semiconductor film;
   forming a gate insulating film and a gate electrode sequentially over the island like semiconductor film;
   adding an impurity to a part of the island like semiconductor film by using the gate electrode to form an impurity region;
   forming a first opening so that the impurity region is exposed and forming a plurality of second openings in the peeling layer so that the first substrate is exposed;
   forming a first conductive film in the first opening and in the second openings;
   processing the first conductive film to form a source or drain electrode in the first opening and to form a wiring in the second openings;
   forming a third opening so that the peeling layer is exposed;
   introducing an etching agent into the third opening and removing the peeling layer to separate a layer having a plurality of thin film transistors comprising the first and second island like semiconductor films from the first substrate; and
   pasting the layer having the plurality of thin film transistors onto a second substrate so that the wiring and a second conductive film provided over the second substrate are electrically connected to each other.

12. The method for manufacturing a semiconductor device according to claim 11, wherein laser irradiation is performed with continuous-wave laser.

13. The method for manufacturing a semiconductor device according to claim 11, further comprising leaving the semiconductor film over the peeling layer so that the marker is formed at the semiconductor film without exposing the peeling layer.

14. The method for manufacturing a semiconductor device according to claim 11, further comprising forming the marker at a film other than the semiconductor film over the peeling layer so that the marker is formed at the semiconductor film without exposing the peeling layer.

15. A method for manufacturing a semiconductor device comprising:
   forming selectively a peeling layer over a first substrate
   forming a base insulating film over the peeling layer;
   removing a part of the base insulating film at a periphery of the first substrate;
   forming a semiconductor film over the base insulating film;
   removing a part of the semiconductor film at a periphery of the first substrate;
   forming a marker at the semiconductor film without exposing the peeling layer;
   emitting a laser to the semiconductor film by employing the marker;
   processing the semiconductor film to form a first island like semiconductor film and a second island like semiconductor film adjacent to the first island like semiconductor film;
   forming a gate insulating film and a gate electrode sequentially over the first island like semiconductor film;
   adding an impurity to a part of the first island like semiconductor film by using the gate electrode to form an impurity region;
   forming a first opening so that the impurity region is exposed and forming a second opening between the first and second island like semiconductor films so that the first substrate is exposed;
   forming a first conductive film in the first opening and in the second opening;
   processing the first conductive film to form a source or drain electrode in the first opening and to form a wiring in the second opening;
   forming a third opening so that the peeling layer is exposed;
   introducing an etching agent into the third opening and removing the peeling layer to separate a layer having a plurality of thin film transistors comprising the first and second island like semiconductor films from the first substrate; and
   pasting the layer having the plurality of thin film transistors onto a second substrate so that the wiring and a second conductive film provided over the second substrate are electrically connected to each other.

16. The method for manufacturing a semiconductor device according to claim 15, wherein laser irradiation is performed with continuous-wave laser.

17. The method for manufacturing a semiconductor device according to claim 15, further comprising leaving the semiconductor film over the peeling layer so that the marker is formed at the semiconductor film without exposing the peeling layer.

18. The method for manufacturing a semiconductor device according to claim 15, further comprising forming the marker at a film other than the semiconductor film over the peeling layer so that the marker is formed at the semiconductor film without exposing the peeling layer.

19. A method for manufacturing a semiconductor device comprising:
   forming selectively a peeling layer over a first substrate;
   forming a base insulating film over the peeling layer;
   removing a part of the base insulating film at a periphery of the first substrate;
   forming a semiconductor film over the base insulating film;
   removing a part of the semiconductor film at the periphery of the first substrate;
   forming a marker at the semiconductor film without exposing the peeling layer;
   emitting a laser to the semiconductor film by employing the marker;
   processing the semiconductor film to form a first island like semiconductor film and a second island like semiconductor film adjacent to the first island like semiconductor film;
   forming a gate insulating film and a gate electrode sequentially over the first island like semiconductor film;

adding an impurity to a part of the first island like semiconductor film by using the gate electrode to form an impurity region;

forming a first opening so that the impurity region is exposed and forming a plurality of second openings between the first and second island like semiconductor films so that the first substrate is exposed;

forming a first conductive film in the first opening and in the second openings;

processing the first conductive film to form a source or drain electrode at the first opening and to form a wiring at the second openings;

forming a third opening so that the peeling layer is exposed;

introducing an etching agent into the third opening portion and removing the peeling layer to separate a layer having a plurality of thin film transistors comprising the first and second island like semiconductor films from the first substrate; and pasting the layer having the plurality of thin film transistors onto a second substrate so that the wiring and a second conductive film provided over the second substrate are electrically connected to each other.

20. The method for manufacturing a semiconductor device according to claim 19, wherein laser irradiation is performed with continuous-wave laser.

21. The method for manufacturing a semiconductor device according to claim 19, further comprising leaving the semiconductor film over the peeling layer so that the marker is formed at the semiconductor film without exposing the peeling layer.

22. The method for manufacturing a semiconductor device according to claim 19, further comprising forming the marker at a film other than the semiconductor film over the peeling layer so that the marker is formed at the semiconductor film without exposing the peeling layer.

23. A method for manufacturing a semiconductor device comprising:

forming selectively a peeling layer over a first substrate;

forming an absorption film so as to be in contact with the peeling layer;

forming a base insulating film over the absorption film;

removing a part of the base insulating film at a periphery of the substrate;

forming a semiconductor film over the base insulating film;

removing a part of the semiconductor film at the periphery of the first substrate;

forming a marker at the semiconductor film without exposing the peeling layer in virtue of the absorption film;

emitting a laser to the semiconductor film by using the marker;

processing the semiconductor film to form a first island like semiconductor film and a second island like semiconductor film adjacent to the first island like semiconductor film;

forming a gate insulating film and a gate electrode sequentially over the first island like semiconductor film;

adding an impurity to a part of the first island like semiconductor film by using the gate electrode to form an impurity region;

forming a first opening so that the impurity region is exposed and forming a second opening between the first and second island like semiconductor films so that the first substrate is exposed;

forming a first conductive film at the first opening and at the second opening;

processing the first conductive film to form a source or drain electrode at the first opening and to form a wiring at the second opening;

forming a third opening so that the peeling layer is exposed;

introducing an etching agent into the third opening and removing the peeling layer to separate a layer having a plurality of thin film transistors comprising the first and second island like semiconductor films from the first substrate; and pasting the layer having the plurality of thin film transistors onto a second substrate so that the wiring and a second conductive film provided over the second substrate are electrically connected to each other.

24. The method for manufacturing a semiconductor device according to claim 23, wherein laser irradiation is performed with continuous-wave laser.

25. The method for manufacturing a semiconductor device according to claim 23, further comprising leaving the semiconductor film over the peeling layer so that the marker is formed at the semiconductor film without exposing the peeling layer.

26. The method for manufacturing a semiconductor device according to claim 23, further comprising forming the marker at a film other than the semiconductor film over the peeling layer so that the marker is formed at the semiconductor film without exposing the peeling layer.

27. A method for manufacturing a semiconductor device comprising:

forming selectively a peeling layer over a first substrate;

forming an absorption film so as to be in contact with the peeling layer;

forming a base insulating film over the absorption film;

removing a part of the base insulating film at a periphery of the first substrate;

forming a semiconductor film over the base insulating film;

removing a part of the semiconductor film at the periphery of the first substrate;

forming a marker at the semiconductor film without exposing the peeling layer in virtue of the absorption film;

emitting a laser to the semiconductor film by using the marker;

processing the semiconductor film to form an island like semiconductor film and a second island like semiconductor film adjacent to the first island like semiconductor film;

forming a gate insulating film and a gate electrode sequentially over the first island like semiconductor film;

adding an impurity to a part of the first island like semiconductor film by using the gate electrode to form an impurity region;

forming a first opening so that the impurity region is exposed and forming a plurality of second openings between the first and second island like semiconductor films so that the first substrate is exposed;

forming a first conductive film at the first opening and at the second openings;

processing the first conductive film to form a source or drain electrode in the first opening and to form a wiring at the second openings;

forming a third opening so that the peeling layer is exposed;

introducing an etching agent into the third opening and removing the peeling layer to separate a layer having a plurality of thin film transistors comprising the first and second island like semiconductor films from the first substrate; and pasting the layer having the plurality of thin film transistors onto a second substrate so that the wiring and a second conductive film provided over the second substrate are electrically connected to each other.

28. The method for manufacturing a semiconductor device according to claim 27, wherein laser irradiation is performed with continuous-wave laser.

29. The method for manufacturing a semiconductor device according to claim 27, further comprising leaving the semiconductor film over the peeling layer so that the marker is formed at the semiconductor film without exposing the peeling layer.

30. The method for manufacturing a semiconductor device according to claim 27, further comprising forming the marker at a film other than the semiconductor film over the peeling layer so that the marker is formed at the semiconductor film without exposing the peeling layer.

* * * * *